US012558758B2

(12) United States Patent
Seo et al.

(10) Patent No.: US 12,558,758 B2
(45) Date of Patent: Feb. 24, 2026

(54) POLISHING PAD AND PREPARING METHOD OF SEMICONDUCTOR DEVICE USING THE SAME

(71) Applicant: SK enpulse Co., Ltd., Gyeonggi-do (KR)

(72) Inventors: Jang Won Seo, Seoul (KR); Sung Hoon Yun, Seoul (KR); Eun Sun Joeng, Gyeonggi-do (KR); Jae In Ahn, Gyeonggi-do (KR)

(73) Assignee: ENPULSE CO., LTD., Chungcheongnam-do (KR)

( * ) Notice: Subject to any disclaimer, the term of this patent is extended or adjusted under 35 U.S.C. 154(b) by 677 days.

(21) Appl. No.: 17/963,380

(22) Filed: Oct. 11, 2022

(65) Prior Publication Data

US 2023/0111352 A1     Apr. 13, 2023

(30) Foreign Application Priority Data

Oct. 12, 2021    (KR) ........................ 10-2021-0134746
Oct. 12, 2021    (KR) ........................ 10-2021-0134792

(51) Int. Cl.
*B24B 37/24*          (2012.01)
*B24B 37/22*          (2012.01)
(Continued)

(52) U.S. Cl.
CPC .............. *B24B 37/24* (2013.01); *B24B 37/22* (2013.01); *B24B 37/26* (2013.01); *H01L 21/31053* (2013.01); *H01L 21/3212* (2013.01)

(58) Field of Classification Search
None
See application file for complete search history.

(56) References Cited

U.S. PATENT DOCUMENTS

2004/0091521 A1    5/2004  Radloff et al.
2005/0197050 A1*   9/2005  Prasad .................. B24B 37/205
                                                       451/41
(Continued)

FOREIGN PATENT DOCUMENTS

CN          107000157 A      8/2017
JP        2008-021340 A      1/2008
(Continued)

OTHER PUBLICATIONS

Office Action for the Korean Patent Application No. 10-2021-0134792 issued by the Korean Intellectual Property Office on Feb. 19, 2024.

(Continued)

*Primary Examiner* — Chinessa T. Golden
(74) *Attorney, Agent, or Firm* — IP & T GROUP LLP

(57)          ABSTRACT

The present disclosure is to provide a polishing pad which is capable of providing physical properties corresponding to various polishing purposes for various polishing objects through the subdivided structural design in a thickness direction, and of securing environmental friendliness by applying a recycled or recyclable material to at least some components, in relation to disposal after use, unlike the conventional polishing pad. Specifically, the polishing pad includes a polishing layer, wherein the polishing layer includes a polishing variable layer having a polishing surface; and a polishing constant layer disposed on a rear surface side of the polishing variable layer opposite to the polishing surface, and wherein the polishing constant layer includes a cured product of a composition having thermosetting polyurethane particles and a binder.

16 Claims, 4 Drawing Sheets

10

(51) Int. Cl.
    *B24B 37/26*       (2012.01)
    *H01L 21/3105*   (2006.01)
    *H01L 21/321*    (2006.01)

(56) References Cited

U.S. PATENT DOCUMENTS

| | | | | |
|---|---|---|---|---|
| 2013/0012108 A1* | 1/2013 | Li | ........................... | B24D 3/28 |
| | | | | 451/529 |
| 2018/0281148 A1* | 10/2018 | Lehuu | ..................... | B24D 3/28 |
| 2021/0129285 A1* | 5/2021 | Joeng | ................. | H01L 21/3212 |

FOREIGN PATENT DOCUMENTS

| | | | |
|---|---|---|---|
| JP | 2015013345 | A | 1/2015 |
| JP | 2018535104 | A | 11/2018 |
| KR | 10-2003-0092787 | A | 12/2003 |
| KR | 20080005573 | A | 1/2008 |
| KR | 10-2015-0021540 | A | 3/2015 |
| KR | 10-1924566 | B1 | 12/2018 |
| TW | 201625381 | A | 7/2016 |

OTHER PUBLICATIONS

Office Action for the Taiwanese Patent Application No. 111138464 issued by the Taiwanese Patent Office on Mar. 31, 2023.
Office Action for the Japanese Patent Application No. 2022-161992 issued by the Japanese Patent Office on Oct. 31, 2023.
Office Action for Chinese Patent Application No. 202211222303.9 issued by the Chinese Patent Office on Oct. 28, 2025.

\* cited by examiner

[FIG. 1]
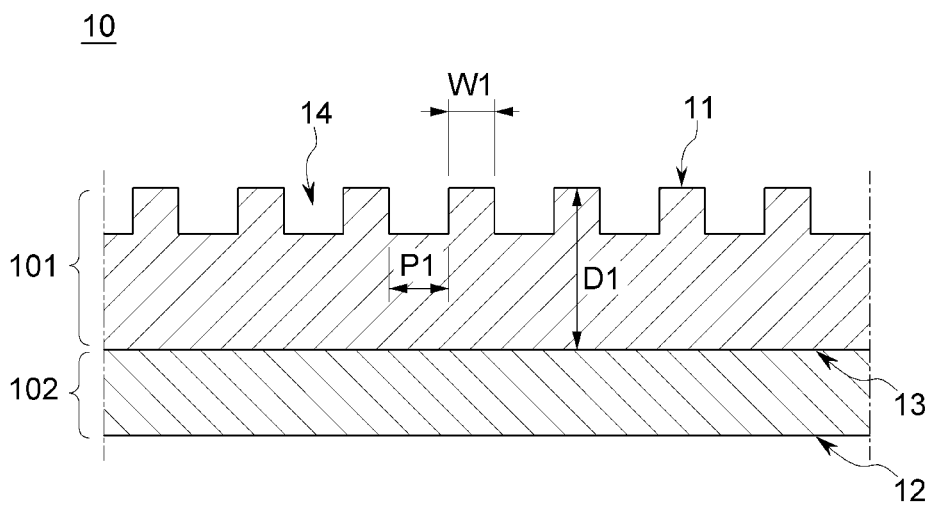

[FIG. 2]
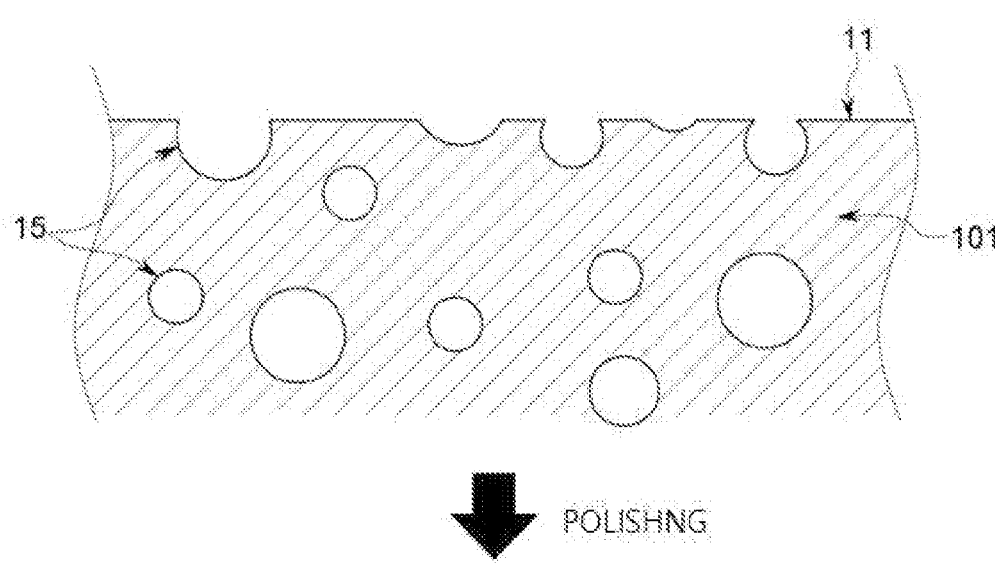
POLISHNG
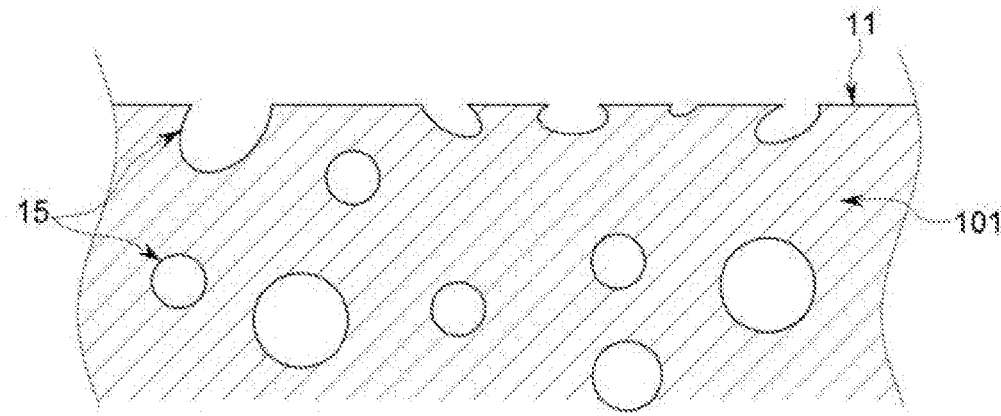

[FIG. 3]
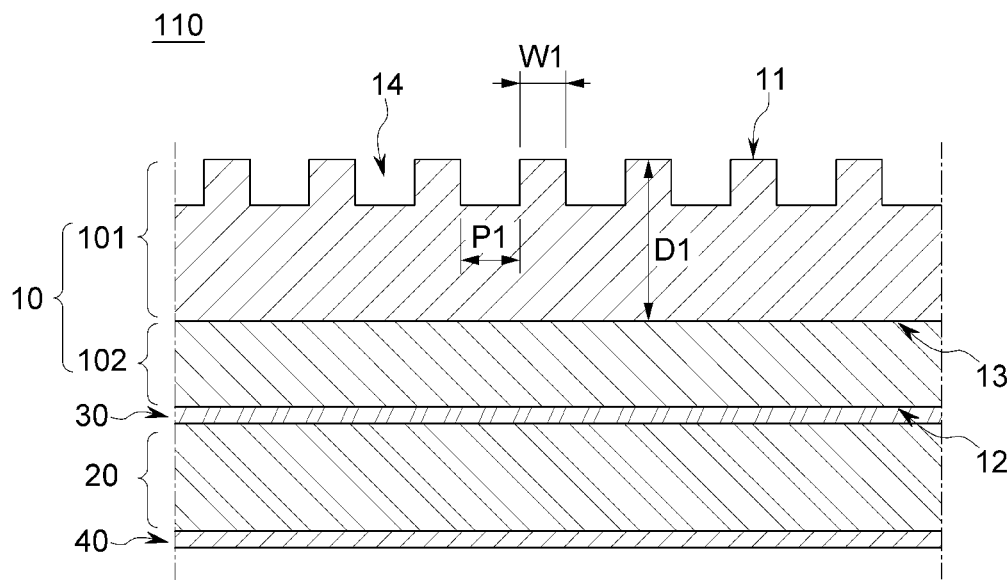

[FIG. 4]
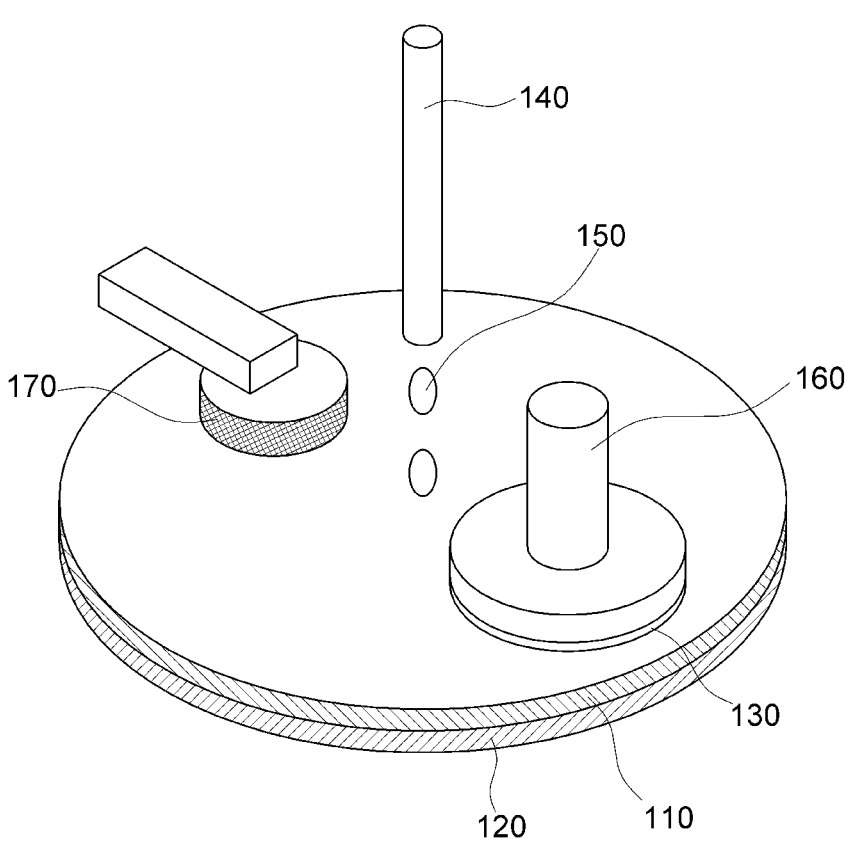

POLISHING PAD AND PREPARING METHOD OF SEMICONDUCTOR DEVICE USING THE SAME

CROSS-REFERENCE OF RELATED APPLICATIONS

This application claims priority to Korean Patent Application No. 10-2021-0134746 and Korean Patent Application No. 10-2021-0134792, filed on Oct. 12, 2021, which are incorporated herein by reference in entirety.

TECHNICAL FIELD

This disclosure relates to a pad applied to a polishing process, and to a technique for applying the same to a method for preparing a semiconductor device.

BACKGROUND ART

A chemical mechanical planarization (CMP) or chemical mechanical polishing (CMP) process may be performed for various purposes in various technical fields. The CMP process may be performed on a predetermined polished surface of a polishing object for the purposes of the planarization of the polished surface, removal of aggregated materials therefrom, resolution of crystal lattice damage, removal of scratches and contamination sources, and the like.

The CMP process technology of the semiconductor process may be classified according to the polishing object film quality or the surface shape after the polishing. For example, it may be divided into single silicon or poly silicon according to the polishing object film quality, and may be classified into various oxide film CMP processes which are discriminated by the kinds of impurities, or into metal film CMP processes which are discriminated by tungsten (W), copper (Cu), aluminum (Al), ruthenium (Ru), tantalum (Ta), and the like. And, according to the surface shape after polishing, it may be classified into a process of alleviating the roughness of the substrate surface, a process of flattening the difference of level caused by multi-layer circuit wirings, and an element isolation process for selectively forming circuit wirings after polishing.

These CMP processes may be applied a plurality of times in the preparing process of a semiconductor device. A semiconductor device includes a plurality of layers, and each layer includes complex and fine circuit patterns. Additionally, in these days, semiconductor devices are developing toward further reduced individual chip sizes, and more complex and finer patterns in each layer. Accordingly, in the process of preparing a semiconductor device, the CMP processes have been employed more widely not only for the purpose of flattening circuit wirings, but also for the separation of circuit wirings, the application of improvement of the wiring surface, and the like, and as a result, more elaborate and reliable CMP performances are required.

The polishing pad used in these CMP processes, which is a component for a process of processing the polished surface to a required level through friction, can be considered as one of the most important factors in the thickness uniformity of the polishing object after polishing, the flatness of the polished surface, and the polishing quality.

SUMMARY OF INVENTION

Technical Problem

An embodiment of the present disclosure is to provide a polishing pad which is capable of providing physical properties corresponding to various polishing purposes for various polishing objects through the subdivided structural design in a thickness direction, and whose long-term polishing performance is not lowered based on appropriate variability in structural changes during the polishing process. Additionally, in relation to the disposal of the polishing pad after use, it is intended to achieve an environment-friendly purpose by applying a recycled or recyclable material to at least some components, unlike the conventional polishing pad.

Another embodiment of the present disclosure is to provide a method for preparing a semiconductor device to which the polishing pad is applied, the method capable of securing diversity of a polished surface of a semiconductor substrate, ensuring excellent polishing flatness and the lowest level of defect generation while securing an appropriate polishing rate for each polished surface, and further, leading to improved results in terms of process productivity and economic feasibility.

Solution to Problem

An embodiment provides a polishing pad which includes a polishing layer, the polishing layer including a polishing variable layer having a polishing surface, and a polishing constant layer disposed on a rear surface side of the polishing variable layer opposite to the polishing surface, and wherein the ratio of shore D hardness of the polishing variable layer and the polishing constant layer is from 0.50 to 1.50.

The polishing variable layer may be from 30% to 60% by volume of the total volume of the polishing layer.

A first polishing variability index of the polishing variable layer according to Equation 1 below may be from 0.1 to 11.0.

$$\frac{(Ri - Rf) \cdot Ti}{(Ti - Tf) \cdot Ri} \qquad \text{[Equation 1]}$$

In Equation 1 above, Ri is the surface roughness (Ra) of the polishing surface at the lifespan introduction time of the polishing variable layer, Rf is the surface roughness (Ra) of the polishing surface at the lifespan end time of the polishing variable layer, Ti is the total thickness of the polishing pad at the lifespan introduction time of the polishing variable layer, and Tf is the total thickness of the polishing pad at the lifespan end time of the polishing variable layer.

The polishing variable layer may include at least one groove on the polishing surface, the groove having a depth that is less than or equal to the total thickness of the polishing variable layer, wherein a second polishing variability index of the polishing variable layer according to Equation 2 below may be from 0.1 to 3.5.

$$\frac{(Ri - Rf) \cdot Gi}{(Gi - Gf) \cdot Ri} \qquad \text{[Equation 2]}$$

In Equation 2 above, Ri is the surface roughness (Ra) of the polishing surface at the lifespan introduction time of the polishing variable layer, Rf is the surface roughness (Ra) of the polishing surface at the lifespan end time of the polishing variable layer, Gi is the depth of the groove at the lifespan introduction time of the polishing variable layer, and Gf is the depth of the groove at the lifespan end time of the polishing variable layer.

The polishing variable layer may include at least one groove on the polishing surface, the groove having a depth that is less than or equal to the total thickness of the polishing variable layer, and the rate of change (%) of the depth of the groove according to Equation 3 below may be from about 20% to about 100%.

$$\frac{(Gi - Gf)}{Gi} \times 100 \qquad \text{[Equation 3]}$$

In Equation 3 above, Gi represents the groove depth at the lifespan introduction time of the polishing variable layer, and Gf represents the groove depth at the lifespan end time of the polishing variable layer.

The polishing pad may have Shore D hardness for an entire laminated structure of 45 to 70.

A ratio of the Shore D hardness of the entire laminated structure of the polishing pad to the Shore D hardness of the polishing layer may be from 0.95 to 1.10.

The polishing variable layer may include a thermosetting resin, and the polishing constant layer may include a thermoplastic resin.

The polishing variable layer may include a cured product of a preliminary composition having a urethane-based prepolymer.

The polishing constant layer may include one selected from the group consisting of polyethylene (PE), polypropylene (PP), polystyrene (PS), polyvinylchloride (PVC), thermoplastic polyurethane (TPU), and combinations thereof.

The polishing constant layer may include a cured product of a composition having thermosetting polyurethane particles and a binder.

An interface between the polishing variable layer and the polishing constant layer may be a separable interface.

The polishing variable layer and the polishing constant layer each may include at least one layer.

An average particle diameter of the thermosetting polyurethane particles may be from 20 µm to 3.0 mm.

The binder may include a first urethane-based prepolymer and a first curing agent.

The composition may include from 15 parts by weight to 150 parts by weight of the binder with respect to 100 parts by weight of the thermosetting polyurethane particles.

The polishing variable layer may include a cured product of a composition including a second urethane-based prepolymer.

In another embodiment, there is provided a method for preparing a semiconductor device, the method including: providing a polishing pad on a surface plate, the polishing pod including a polishing layer with a polishing surface; and polishing a polishing object while rotating the polishing pad and the polishing object relative to each other under a pressure condition, after arranging the polishing object to be in contact with the polishing surface, wherein the polishing layer includes a polishing variable layer including the polishing surface, and a polishing constant layer disposed on a rear side of the polishing surface of the polishing variable layer, and wherein the polishing constant layer includes a cured product of a composition having thermosetting polyurethane particles and a binder.

A load by which a polished surface of the polishing object is pressed against the polishing surface of the polishing layer may be from 0.01 psi to 20 psi.

Advantageous Effects

The polishing pad can realize effects that are capable of providing physical properties corresponding to various polishing purposes for various polishing objects through the subdivided structural design in a thickness direction, and of providing long-term polishing performance which is not lowered based on appropriate variability in structural changes during the polishing process. Additionally, in relation to the disposal after use, the polishing pad can secure environmental friendliness by applying a recycled or recyclable material to at least some components, unlike the conventional polishing pad.

The method for preparing a semiconductor device to which the polishing pad is applied can secure diversity of a polished surface of a semiconductor substrate, ensure excellent polishing flatness and the lowest level of defect generation while securing an appropriate polishing rate for each polished surface, and further, lead to improved results in terms of process productivity and economic feasibility.

BRIEF DESCRIPTION OF DRAWINGS

FIG. 1 schematically shows a cross-sectional view of the polishing layer according to an embodiment.

FIG. 2 schematically shows changes in a polishing surface of the polishing layer according to an embodiment during a polishing process.

FIG. 3 schematically shows a cross-sectional view of the polishing pad according to an embodiment.

FIG. 4 is a schematic view schematically showing a method for preparing a semiconductor device according to an embodiment.

DESCRIPTION OF EMBODIMENTS

Hereinafter, embodiments of the present disclosure will be described in detail such that those of ordinary skill in the art can easily practice them. However, the disclosure can be embodied in various different forms, and the scope of the disclosure should not be construed as being limited to the embodiments described herein.

Advantages and features of the present disclosure, and methods for achieving them will become apparent with reference to the embodiments or examples to be discussed later. However, the present disclosure is not limited to the embodiments or examples to be disclosed below, but may be implemented in various different forms. However, the embodiments or examples to be specified below are only provided to make the disclosure complete, and to inform those of ordinary skill in the art to which the present disclosure belongs about the scope of the invention, and the right scope of the present disclosure is defined by the scope of the claims.

In the drawings, as needed, the thicknesses of some components are enlarged in order to clearly express the layer or region. Additionally, in the drawings, the thicknesses of some layers and regions are exaggerated for convenience of description. Like reference numerals refer to like components throughout the specification.

Herein, when it is stated that a portion of a layer, film, region, plate, or the like is "on" or "on the top of" another portion, it is construed as including not only the case where it is "directly on" another portion, but also the case where other portion is interposed therebetween. When a portion is described as being "directly on" another portion, it is construed as meaning that there is no other portion therebetween. Additionally, when it is stated that a portion of a layer, film, region, plate, or the like is "under" or "under the bottom of" another portion, it is construed as including not only the case where it is "directly under" another portion, but also the case where other portion is interposed therebetween. When a portion is described as being "directly under" another portion, it is construed as meaning that there is no other portion therebetween.

In the present specification, when representing a numerical range, the meaning of '~equal to or greater than' is construed as including that number or numbers greater than that number. For example, 'equal to or greater than two' means two or other numbers greater than two. In addition, the description of 'from X to Y' for a numerical range is construed as a range including X or Y. For example, 'from 25 to 50' means a numerical range including 25 and 50.

Hereinafter, exemplary embodiments according to the present disclosure will be described in detail.

In an embodiment of the present disclosure, there is provided a polishing pad including a polishing layer. The polishing layer including a polishing variable layer having a polishing surface, and a polishing constant layer disposed on a rear surface side of the polishing variable layer opposite to the polishing surface, and the ratio of the Shore D hardness of the polishing variable layer and the Shore D hardness of the polishing constant layer may be from 0.50 to 1.50.

FIG. 1 schematically illustrates a cross-sectional view taken in the thickness direction of the polishing layer 10 according to an embodiment. Hereinafter, the terms 'polishing surface' and 'first surface' may be used to refer to the same component.

Referring to FIG. 1, the polishing layer 10 may include the polishing variable layer 101 having the polishing surface 11. The polishing layer 10 may also include the polishing constant layer 102 provided to support the polishing variable layer 101. The polishing constant layer 102 may be removably adhered to the polishing variable layer 101. Each of the polishing variable layer 101 and the polishing constant layer 102 may include at least one layer.

Putting it differently, the polishing layer 10 includes a first surface 11 which is a polishing surface, and a second surface 12 which is a rear surface thereof. Further, the polishing layer 10 includes at least one separable interface 13 between the first surface 11 and the second surface 12. Herein, the 'separable interface' refers to an interface with respect to which two adjacent layers can be discriminated as discontinuous structures rather than a substantially continuous structure. For example, the separable interface is one that is detached or separated by a predetermined external force, and may correspond to an attachment surface using an adhesive layer as a medium.

In the polishing layer 10, the ratio of Shore D hardness of the polishing variable layer 101 and the polishing constant layer 102 may be from about 0.50 to about 1.50. Putting it differently, in the polishing layer 10, the ratio of Shore D hardness of two adjacent layers with respect to the separable interface 13 may be from about 0.50 to about 1.50. FIG. 1 shows, for example, a case in which there is one separable interface 13 between the first surface 11 and the second surface 12. Referring to it, the ratio of Shore D hardness of the two adjacent layers 101 and 102 with respect to the separable interface 13 may be from about 0.50 to about 1.50. The ratio of Shore D hardness may be, for example, from about 0.50 to about 1.50, for example, from about 0.60 to about 1.50, for example, from about 0.70 to about 1.40, or, for example, from about 0.80 to about 1.20. The ratio of D hardness may be considered to be satisfied when any one of the ratio (db/Da) of the hardness of the other layer (db) to the hardness of one layer (Da); and a ratio (Da/db) of the hardness (Da) of the one layer to the hardness (db) of the other layer falls within the above range. That is, a desired technical effect can be realized when both of them satisfy the above range as well as when either one of them satisfies the ratio within the above range.

In an embodiment, the ratio (H2/H1) of the Shore D hardness (H2) of the polishing constant layer to the Shore D hardness (H1) of the polishing variable layer may be from about 0.5 to about 1.0, for example, from about 0.7 to about 1.0, for example, from about 0.8 to about 1.0.

In an embodiment, the ratio (H1/H2) of the Shore D hardness (H1) of the polishing variable layer to the Shore D hardness (H2) of the polishing constant layer may be from about 1.0 to about 1.5, for example, from about 1.0 to about 1.4, for example, from about 1.0 to about 1.2.

The polishing pad may be employed in polishing processes for various purposes. For example, the polishing pad may be applied to a preparing process of a semiconductor device. Recently, semiconductor devices are required to have a higher degree of integration and a more three-dimensionally complicated structure. In order to meet such requirements, fine process control is essential in the preparing process of a semiconductor device. The semiconductor device includes various materials and various types of thin films, and thus requires a polishing process to have process conditions finely adjusted according to the material and shape of each thin film. The polishing pad is one of these fine process control factors, and the polishing result of the semiconductor device may vary significantly even by minute differences in the structure, material, and shape of the polishing pad.

In the polishing pad including the polishing layer 10, physical properties produced from the overall structural and/or compositional characteristics thereof are transferred to the polished surface of the polishing object through the polishing surface 11. In this regard, the ratio of Shore D hardness of the two adjacent layers 101 and 102 with respect to the separable interface 13 in the polishing layer 10 satisfies the above-mentioned range, so that the polishing characteristics transferred to the polished surface of the polishing object through the polishing surface 11 can secure optimal conditions for realizing the target polishing performance of a semiconductor device.

Referring to FIG. 1, the polishing layer 10 may include at least one polishing variable layer 101 which is a region from the polishing surface 11 to the separable interface 13; and at least one polishing constant layer 102 which is a region from the separable interface 13 to the second surface 12. Herein, the 'polishing variable layer' refers to a region whose physical characteristics, such as structure and shape, and/or chemical characteristics, such as composition, change during a polishing process using the polishing pad, and the 'polishing constant layer' refers to a region whose physical and/or chemical characteristics do not substantially change during a polishing process using the polishing pad. The 'do not substantially change' may be construed as including a case where the physical and/or chemical characteristics are not changed at all, as well as a case where physical and/or chemical characteristics may be slightly changed during the polishing under a pressurized environment and a wet environment, but it is at a fairly insignificant level compared to the polishing variable layer, thus being regarded as a case where there is no substantial change.

FIG. 1 illustratively shows a case where there is one separable interface 13, but if necessary, the polishing layer 10 may include at least two separable interfaces 13 between the polishing surface 11 and the second surface 12. In this case, the polishing variable layer 101 or the polishing constant layer 102 may include a plurality of layers.

By designing the polishing layer 10 to include at least one polishing variable layer 101 and at least one polishing constant layer 102, precise structural design in the thickness direction is possible, and as a result of the organically interacted physical properties of respective layers stacked in the thickness direction in this way, it is possible to finely and precisely control the polishing performance produced through the polishing surface 11 according to the purpose.

In an embodiment, the polishing variable layer 101 may be from about 30% by volume to about 60% by volume of the total volume of the polishing layer 10, for example, from about 40% by volume to about 60% by volume, or, for example, from about 45% by volume to about 55% by volume. When the volume of the polishing variable layer 101 of the total volume of the polishing layer 10 satisfies the above range, the above-described technical advantages of the polishing variable layer 101 and the polishing constant layer 102 can be secured, and at the same time, it can be advantageous for realizing the process lifespan of the polishing pad at a desired level.

In an embodiment, the polishing variable layer may have a first polishing variability index of about 0.1 to about 11.0 according to Equation 1 below.

$$\frac{(Ri - Rf) \cdot Ti}{(Ti - Tf) \cdot Ri} \qquad \text{[Equation 1]}$$

In Equation 1 above, Ri is the surface roughness (Ra) of the first surface at the lifespan introduction time of the polishing variable layer, Rf is the surface roughness (Ra) of the first surface at the lifespan end time of the polishing variable layer, Ti is the total thickness of the polishing pad at the lifespan introduction time of the polishing variable layer, and Tf is the total thickness of the polishing pad at the lifespan end time of the polishing variable layer.

As described above, the polishing variable layer 101 is a region whose physical and/or chemical properties change during a polishing process to which the polishing pad is applied, and has a predetermined lifespan in terms of providing a desired level of polishing performance. The lifespan introduction time of the polishing variable layer 101 refers to an arbitrary time point between after the polishing variable layer or the polishing pad is manufactured and before it is applied to a process. Additionally, the lifespan end time of the polishing variable layer 101 refers to a time point when the polishing variable layer 101 no longer realizes the polishing performance, and thus the polishing variable layer or the entire polishing pad needs to be replaced. For example, the lifespan end time may be defined as a time point when the polishing rate of the polished surface of the polishing object changes by 20% compared to the initial polishing rate within 1 hour after starting polishing. That is, the initial polishing rate is a polishing rate value measured within 1 hour after starting polishing on the polished surface, and the lifespan end time may be defined as a time point when the polishing rate for the polished surface is increased by 20% or decreased by 20% compared to the initial polishing rate.

The first polishing variability index has surface roughnesses (Ri, Rf) and the total thicknesses (Ti, Tf) of the polishing pad 110 of each of the lifespan introduction time and the lifespan end time of the polishing variable layer 101 as components. The first polishing variability index according to Equation 1 may serve as an index indicating the variable performance of the polishing variable layer 101. That is, when the value of Equation 1 of the polishing variable layer represents the above-mentioned range, that is, the range of about 0.1 to about 11.0, the polishing variable layer has a corresponding variability, so that when being applied as a part of the polishing layer 10, it can continuously and uniformly exhibit structural characteristics optimized for polishing efficiency over its lifespan.

In an embodiment, the first polishing variability index may be from about 0.1 to 11.0, for example, from about 0.1 to about 9.0, for example, from about 0.2 to about 9.0, for example, from about 0.2 to about 8.5, for example, from about 0.2 to about 8.0, for example, from about 0.2 to about 7.5, for example, from about 0.5 to about 7.5, for example, from about 0.8 to about 7.5, for example, from about 0.9 to about 7.5, for example, from about 1.0 to about 6.0, for example, from about 1.8 to 3.5, or, for example, from about 1.8 to 2.5.

Ti may be, for example, from about 800 µm to about 5000 µm, for example, from about 1000 µm to about 4000 µm, for example, from about 1000 µm to 3000 µm, for example, from about 1500 µm to about 3000 µm, for example, from about 1700 µm to about 2700 µm, or, for example, from about 2000 µm to about 3500 µm, but is not limited thereto.

Ri may be, for example, from about 5 µm to about 15 µm, for example, from about 5 µm to about 12 µm, or, for example, from about 5 µm to 10 µm, but is not limited thereto.

In an embodiment, when Ti and Ri each satisfy the above-mentioned ranges, and at the same time, the first polishing variability index satisfies the above-mentioned range, it may be more advantageous in terms of realizing excellent polishing performance resulting from the structural characteristics of the polishing variable layer 101.

In an embodiment, the polishing variable layer 101 may include at least one groove 14 on the polishing surface 11, the groove having a depth d1 smaller than or equal to the total thickness D1 of the polishing variable layer 101. The groove 14 can play a role in appropriately realizing physical polishing characteristics by adjusting the fluidity of the polishing liquid or polishing slurry supplied to the polishing surface 11 during the polishing process using the polishing pad, or by adjusting the size of the area in which the polishing surface 11 and the polished surface of a polishing object are in direct contact with each other.

For example, the polishing pad 110 may include a plurality of grooves 14 in the polishing surface 11. In an embodiment, the planar shape of the polishing pad 110 may be substantially circular, and the plurality of grooves 14 may have a concentric circular structure in which they are spaced apart at a predetermined distance from the center on the planar surface of the polishing pad 110 toward the edge. In another embodiment, the plurality of grooves 14 may have a radial structure in which they are continuously formed from the center on the planar surface of the polishing pad 110 toward the edge. In still another embodiment, the plurality of grooves 14 may include concentric circular grooves and radial grooves at the same time.

In the polishing variable layer 101 which is a region from the polishing surface 11 to the separable interface 13, when the polishing surface 11 includes at least one groove 14, the second polishing variability index according to Equation 2 below of the polishing variable layer 101 may be from about 0.1 to about 3.5.

$$\frac{(Ri - Rf) \cdot Gi}{(Gi - Gf) \cdot Ri} \qquad \text{[Equation 2]}$$

In Equation 2 above, Ri is the surface roughness (Ra) of the first surface at the lifespan introduction time of the polishing variable layer, Rf is the surface roughness (Ra) of the first surface at the lifespan end time of the polishing variable layer, Gi is the depth of the groove at the lifespan introduction time of the polishing variable layer, and Gf is the depth of the groove at the lifespan end time of the polishing variable layer.

The description of the lifespan introduction time and the lifespan end time of the polishing variable layer 101 is the same as described above with respect to the first polishing variability index according to Equation 1 above. When the second polishing variability index of the polishing variable layer 101 satisfies the above-mentioned range, the polishing variable layer 101 can provide a structure optimized in terms of fluidity of the polishing liquid or polishing slurry, and a direct contact area on the first surface provided with respect to the polished surface can be secured at an appropriate level, which may be more advantageous for securing a polishing rate within a target range.

In an embodiment, the second polishing variability index may be from about 0.1 to about 3.5, for example, from about 0.1 to about 3.3, for example, from about 0.1 to about 3.0, for example, from about 0.1 to about 2.0, for example, from about 0.3 to about 1.8, for example, from about 0.5 to about 1.5, for example, from about 0.5 to about 1.2, for example, from about 0.5 to about 1.0, or, for example, from about 0.6 to about 1.0.

The Gi may be, for example, from about 600 μm to about 900 μm, for example, from about 650 μm to about 900 μm, or, for example, from about 700 μm to about 900 μm, but is not limited thereto.

In an embodiment, when Ri and Gi each satisfy the above-mentioned ranges, and at the same time, the second polishing variability index satisfies the above-mentioned range, it may be more advantageous in terms of realizing the polishing performance by the structural characteristics of the polishing variable layer 101.

In an embodiment, in the polishing variable layer 101, each of the first polishing variability index and the second polishing variability index may simultaneously satisfy the aforementioned ranges. When the first polishing variability index and the second polishing variability index each satisfy the above-described ranges, the polishing variable layer 101 as a part of the polishing layer 10 can have structural characteristics optimized for polishing efficiency, and particularly, the polishing variable layer 101 can provide a structure optimized in terms of fluidity of the polishing liquid or polishing slurry, and a direct contact area on the first surface provided with respect to the polished surface can be secured at an appropriate level, which may be more advantageous for securing a polishing rate within a target range. Furthermore, it may be more advantageous for realizing a consistent polishing performance so that the aforementioned benefits are maintained throughout its lifespan.

When the polishing surface 11 includes at least one groove 14 having a depth equal to or smaller than the total thickness of the polishing variable layer 101, the rate of change (%) of the depth of the groove 14 in the polishing variable layer 101 according to Equation 3 below may be from about 20% to about 100%.

$$\frac{(Gi - Gf)}{Gi} \times 100 \qquad \text{[Equation 3]}$$

In Equation 3 above, Gi represents the groove depth at the lifespan introduction time of the polishing variable layer 101, and Gf represents the groove depth at the lifespan end time of the polishing variable layer 101.

The descriptions regarding the lifespan introduction time and lifespan end point of the polishing variable layer 101, Gi, and Gf are all the same as those described above with respect to the second polishing variability index.

In an embodiment, the rate of change of groove depth according to Equation 3 above may be from about 20% to about 80%, for example, from about 30% to 80%, for example, from about 40% to about 80%, for example, from about 45% to about 75%, or, for example, from about 50% to about 70%.

In an embodiment, the rate of change of groove depth according to Equation 3 above may be from about 20% to about 80%, for example, from about 30% to 80%, for example, from about 40% to about 80%, for example, from about 40% to about 70%, or, for example, from about 40% to about 50%.

Referring to FIG. 1, the depth d1 of the groove 14 is changed from the depth Gi at the lifespan introduction time to the depth Gf at the lifespan end time during the polishing process. Specifically, as the polishing surface 11 and the polished surface of a polishing object are polished by physical contact with each other, thereby cutting the polishing surface 11, the depth d1 of the groove 14 gradually becomes shallower. In this regard, the value of Equation 3 above employing the depth Gi of the groove at the lifespan introduction time and the depth of the groove Gf at the lifespan end time as factors can satisfy the above-mentioned range when physical characteristics such as the elongation, tensile strength, hardness and the like of the polishing variable layer 101 are properly supported. Specifically, if the physical properties of the polishing variable layer 101 are not properly supported, the influence on the polishing performance induced by a change in the fluidity of the polishing slurry or the like increases with the more shallow depth d1 of the groove, and so there is a concern regarding the occurrence of the abrupt deterioration of the overall polishing performance. When the value of Equation 3 above satisfies the above-mentioned range, the polishing variable layer 101 according to an embodiment can exhibit the optimum physical properties corresponding thereto, based on which, even if the depth d1 of the groove becomes shallow, the influence on the polishing performance can be minimized to realize excellent polishing performance throughout the polishing process. Additionally, as the usage period of the polishing variable layer 101 is maximized, an effect of extending the lifespan of the polishing pad can be obtained.

Referring to FIG. 1, the width w1 of the groove 14 may affect the size of a physical contact area between the polishing surface 11 and the polished surface of a polishing object during the polishing process. Accordingly, the required polishing performance can be realized by appropriately designing the width w1 of the groove 14 according to the type of the polishing object, the type of the polishing liquid or the polishing slurry, the target polishing performance, and the like. For example, the width w1 of the groove 14 may be from about 0.2 mm to about 1.0 mm, for example, from about 0.3 mm to about 0.8 mm, for example, from about 0.4 mm to about 0.7 mm, or, for example, from about 0.4 mm to about 0.6 mm.

When the polishing variable layer 101 includes a plurality of grooves 14 on the polishing surface 11, the pitch p1 of the groove 14, which is defined as the spacing between two adjacent grooves 14, can also be appropriately designed under the same context as the width w1 of the groove 14, thereby contributing to the realization of the required polishing performance. For example, the pitch p1 of the grooves 14 may be from about 1.5 mm to about 5.0 mm, for example, from about 1.5 mm to about 4.0 mm, or, for example, from about 1.5 mm to about 3.0 mm.

Although the numerical value ranges of the width w1 and the pitch p1 of the grooves is a structural configuration which substantially does not change during the polishing process, for example, each of the ranges may be a value measured based on the lifespan introduction time of the polishing variable layer 101.

In an embodiment, the polishing variable layer 101 and the polishing constant layer 102 may be made of mutually different materials. Herein, the term 'different materials' should be understood to include not only a case where there is no overlapping component, but also a case where, although some same components are included, the overall composition is different, and recognized as a qualitatively different material. By configuring the polishing variable layer 101 and the polishing constant layer 102 with mutually different materials, the physical properties across the thickness direction of the polishing pad can be designed more precisely and finely, thereby enabling the realization of the polishing performance according to various purposes of various uses.

In an embodiment, the polishing variable layer may include a thermosetting resin, and the polishing constant layer may include a thermoplastic resin. In this case, the physical properties across the thickness direction of the polishing pad can be designed more precisely and finely, thereby enabling the realization of the polishing performance according to various purposes of various uses.

For example, the polishing variable layer 101 may include a cured product of a preliminary composition including a urethane-based prepolymer. In an embodiment, the cured product may be a thermally cured product. In an embodiment, the preliminary composition may further include a curing agent and a blowing agent. The 'prepolymer' refers to a polymer of a relatively low molecular weight, whose polymerization degree is stopped at an intermediate stage to facilitate molding in the production of a cured product. The prepolymer itself undergoes an additional curing process, such as heating, pressurization or/and the like, or may be mixed with another polymerizable compound, for example, an additional compound such as a heterogeneous monomer or a heterogeneous prepolymer, and reacted, and then may be molded into a final cured product.

In an embodiment, the urethane-based prepolymer may be prepared by reacting an isocyanate compound with a polyol compound.

The isocyanate compound used in the preparation of the urethane-based prepolymer may use one selected from the group consisting of aromatic diisocyanate, aliphatic diisocyanate, cycloaliphatic diisocyanate, and combinations thereof. For example, the isocyanate compound may include aromatic diisocyanate. For example, the isocyanate compound may include aromatic diisocyanate and cycloaliphatic diisocyanate.

The isocyanate compound may include, for example, one selected from the group consisting of 2,4-toluenediisocyanate (2,4-TDI), 2,6-toluenediisocyanate (2,6-TDI), naphthalene-1,5-diisocyanate, p-phenylenediisocyanate, tolidinediisocyanate, 4,4'-diphenylmethanediisocyanate, hexamethylenediisocyanate, dicyclohexylmethanediisocymate, 4,4'-dicyclohexylmethanediisocyanate ($H_{12}$MDI), isophorone diisocyanate, and combinations thereof.

The 'polyol' refers to a compound including at least two or more hydroxyl groups (—OH) per molecule. In an embodiment, the polyol compound may include a dihydric alcohol compound having two hydroxyl groups, that is, diol or glycol; or a trihydric alcohol compound having three hydroxyl groups, that is, a triol compound.

The polyol compound may include, for example, one selected from the group consisting of polyether polyol, polyester polyol, polycarbonate polyol, acryl polyol, and combinations thereof.

The polyol compound may include one selected from the group consisting of, for example, polytetramethylene ether glycol (PTMG), polypropylene ether glycol, ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-1,5-pentanediol, 1,6-hexanediol, diethylene glycol (DEG), dipropylene glycol (DPG), tripropylene glycol, polypropylene glycol, polypropylene triol, and combinations thereof.

The polyol compound may have a weight average molecular weight (Mw) of about 100 g/mol to about 3,000 g/mol, for example, about 100 g/mol to about 2,000 g/mol, or, for example, about 100 g/mol to about 1,800 g/mol.

In an embodiment, the polyol compound may include a low molecular weight polyol having a weight average molecular weight (Mw) of about 100 g/mol or more and less than about 300 g/mol, and a high molecular weight polyol having a weight average molecular weight (Mw) of about 300 g/mol or more and about 1800 g/mol or less. The weight average molecular weight (Mw) of the high molecular weight polyol may be, for example, about 500 g/mol or more, and about 1,800 g/mol or less, or, for example, about 700 g/mol or more, and about 1,800 g/mol or less. In this case, the polyol compound may form an appropriate cross-linked structure in the urethane-based prepolymer, and the polishing variable layer 101 formed by curing the preliminary composition including the urethane-based prepolymer under predetermined process conditions may be more advantageous for realizing the above-described effects.

The urethane-based prepolymer may have a weight average molecular weight (Mw) of about 500 g/mol to about 3,000 g/mol, for example, about 600 g/mol to about 2,000 g/mol, or, for example, about 800 g/mol to about 1,000 g/mol. When the urethane-based prepolymer has the polymerization degree corresponding to the above-described weight average molecular weight (Mw), the polishing variable layer 101 formed by curing the preliminary composition under predetermined process conditions may be more advantageous for realizing the above-described effects.

In an embodiment, the isocyanate compound for preparing the urethane-based prepolymer may include an aromatic diisocyanate. The aromatic diisocyanate may include, for example, 2,4-toluene diisocyanate (2,4-TDI), or may include, for example, 2,4-toluene diisocyanate (2,4-TDI)

and 2,6-toluenediisocyanate (2,6-TDI). In addition, the polyol compound for preparing the urethane-based prepolymer may include, for example, polytetramethylene ether glycol (PTMG) and diethylene glycol (DEG).

In another embodiment, the isocyanate compound for preparing the urethane-based prepolymer may include aromatic diisocyanate and cycloaliphatic diisocyanate. The aromatic diisocyanate may include, for example, 2,4-toluene diisocyanate (2,4-TDI), or may include, for example, 2,4-toluene diisocyanate (2,4-TDI) and 2,6-toluenediisocyanate (2,6-TDI). The cycloaliphatic diisocyanate may include, for example, 4,4'-dicyclohexylmethane diisocyanate ($H_{12}$MDI). In addition, the polyol compound for preparing the urethane-based prepolymer may include, for example, polytetramethylene ether glycol (PTMG) and diethylene glycol (DEG).

In an embodiment, based on 100 parts by weight of the total weight of the isocyanate compound, the total weight of the polyol compound may be from about 100 parts by weight to about 180 parts by weight, for example, greater than about 100 parts by weight and up to about 180 parts by weight, for example, from about 110 parts by weight to about 160 parts by weight, or, for example, from about 120 parts by weight to about 150 parts by weight.

In another embodiment, based on 100 parts by weight of the total weight of the isocyanate compound, the total weight of the polyol compound may be greater than about 180 parts by weight and up to about 250 parts by weight, for example, from about 185 parts by weight to about 250 parts by weight, or, for example, from about 190 parts by weight to about 240 parts by weight.

In an embodiment, the polyol compound may include polytetramethylene ether glycol (PTMG), and the content of the polytetramethylene ether glycol (PTMG) may be from about 100 parts by weight to about 250 parts by weight, for example, greater than about 100 parts by weight and up to about 250 parts by weight, for example, from about 110 parts by weight to about 220 parts by weight, or, for example, from about 110 parts by weight to about 140 parts by weight, with respect to 100 parts by weight of the total weight of the isocyanate compound.

In another embodiment, the polyol compound may include polytetramethylene ether glycol (PTMG), and the content of the polytetramethylene ether glycol (PTMG) may be from about 150 parts by weight to about 250 parts by weight, for example, from about 180 parts by weight to about 230 parts by weight, with respect to 100 parts by weight of the total weight of the isocyanate compound.

In an embodiment, the polyol compound may include diethylene glycol (DEG), and the content of the diethylene glycol (DEG) may be from about 1 part by weight to about 20 parts by weight, for example, from about 1 part by weight to about 15 parts by weight, with respect to 100 parts by weight of the total weight of the isocyanate compound.

In an embodiment, the isocyanate compound may include the aromatic diisocyanate, and the aromatic diisocyanate may include 2,4-TDI and 2,6-TDI, and the content of 2,6-TDI may be from about 1 part by weight to about 40 parts by weight, for example, from about 1 part by weight to about 30 parts by weight, for example, from about 3 parts by weight to about 28 parts by weight, or, for example, about 20 parts by weight to about 30 parts by weight, with respect to 100 parts by weight of the 2,4-TDI.

In another embodiment, the content of 2,6-TDI may be from about 1 part by weight to about 40 parts by weight, for example, from about 1 part by weight to about 30 parts by weight, for example, from about 1 part by weight to about 20 parts by weight, or, for example, about 1 part by weight to about 10 parts by weight, with respect to 100 parts by weight of the 2,4-TDI.

In an embodiment, the isocyanate compound may include the aromatic diisocyanate and the cycloaliphatic diisocyanate, and the content of the cycloaliphatic diisocyanate may be from about 5 parts by weight to about 30 parts by weight, for example, about 10 parts by weight to about 25 parts by weight, with respect to total 100 parts by weight of the aromatic diisocyanate.

When the preliminary composition satisfies the above-described compositional characteristics, the polishing variable layer 101 prepared through the curing of the preliminary composition can exhibit appropriate physical/mechanical properties, and when the rate of change of the groove depth according to Equation 3 satisfies the above-mentioned range, it can contribute to realization of uniform polishing performance and maximization of lifespan. It may also be advantageous for realizing excellent polishing performance by providing excellent rigidity and elasticity to the polishing object through the polishing surface 11 based on the physical/mechanical properties.

The preliminary composition may have an isocyanate group content (NCO %) of about 5 wt % to about 11 wt %, for example, about 5 wt % to about 10 wt %. In an embodiment, the isocyanate group content (NCO %) may be from about 5 wt % to about 8.5 wt %, and, in another embodiment, the isocyanate group content (NCO %) may be from about 8.5 wt % to about 10 wt %. The 'isocyanate group content' refers to a percentage of the weight of isocyanate groups (—NCO) present as free reactive groups without urethane reaction in the total weight of the preliminary composition. The isocyanate group content (NCO %) of the preliminary composition may be designed by synthetically adjusting the kind and content of the monomer for preparing the urethane-based prepolymer, process conditions such as temperature and pressure of the urethane-based prepolymer preparing process, and the kind of additive used for preparing the urethane-based prepolymer. When the isocyanate group content satisfies the aforementioned range, it can be advantageous for the polishing variable layer 101 prepared through the curing of the preliminary composition to secure appropriate physical/mechanical characteristics, and when the polishing variable layer is applied in a laminated state with the polishing constant layer 102, it can be advantageous for imparting excellent polishing performance through the polishing surface 11 to the polishing object.

In an embodiment, the preliminary composition may further include a curing agent. The curing agent may be a compound for chemically reacting with the urethane-based prepolymer to form a final cured structure in the polishing variable layer 101, and may include, for example, an amine compound or an alcohol compound. Specifically, the curing agent may include one selected from the group consisting of aromatic amines, aliphatic amines, aromatic alcohols, aliphatic alcohols, and combinations thereof.

For example, the curing agent may include one selected from the group consisting of 4,4'-methylenebis(2-chloroaniline) (MOCA), diethyltoluenediamine (DETDA), diaminodiphenylmethane, dimethyl thio-toluene diamine (DMTDA), propanediol bis p-aminobenzoate, methylene bis-methylanthranilate, diaminodiphenylsulfone, m-xylylenediamine, isophoronediamine, ethylenediamine, diethylenetriamine, triethylenetetramine, polypropylenediamine, polypropylenetriamine, bis(4-amino-3-chlorophenyl)methane, and combinations thereof.

The preliminary composition may include about 18 parts by weight to about 27 parts by weight of the curing agent, for example, about 19 parts by weight to about 26 parts by weight, or, for example, about 20 parts by weight to about 26 parts by weight, with respect to 100 parts by weight of the total weight. When the content of the curing agent satisfies the aforementioned range, it can be more advantageous for realizing the desired performance of the polishing pad.

The molar ratio of isocyanate groups (—NCO) in the preliminary composition and reactive groups of the curing agent (NCO:reactive groups) may be from about 1:0.80 to about 1:1.20, for example, from about 1:0.90 to about 1:1.10, for example, from about 1:0.90 to about 1:1.00, or, for example, about 1:90 or more and less than about 1:1.00. The reactive group may vary depending on the kind of the curing agent, but may be, for example, an amine group (—NH$_2$) or a hydroxyl group (—OH). When the molar ratio of the isocyanate group in the preliminary composition and the reactive group in the curing agent satisfies the aforementioned range, an appropriate cross-linked structure can be formed by a chemical reaction of the urethane-based prepolymer in the preliminary composition with the curing agent, and as a result, the polishing variable layer 101 can secure an appropriate level of physical/mechanical properties, such as tensile strength and elongation rate, thereby enabling the transfer of excellent polishing performance to the polished surface of the polishing object through the polishing surface 11.

The polishing variable layer 101 may be of a porous structure including a plurality of pores 15. The plurality of pores 15 located on the uppermost surface of the polishing variable layer 101 may expose at least a portion of their interiors to the outside to impart a predetermined surface roughness to the polishing surface 11. FIG. 2 schematically shows a structural change of the polishing surface 11 according to an embodiment during a polishing process. Specifically, FIG. 2 is a schematic view schematically showing that a portion of the plurality of pores 15 according to an embodiment, which expose their interiors to the outside of the polishing surface 11, are subjected to the structural change during a polishing process. Referring to FIG. 2, since the plurality of pores 15 are distributed across the polishing variable layer 101, they can continuously contribute to the formation of the surface roughness even if the top surface is gradually cut during the polishing process with the polishing surface 11. However, as for the pores 15 whose interiors are exposed to the polishing surface 11, as the polishing process continues to be performed under a predetermined pressure condition, the portion corresponding to the boundary between the polishing surface 11 and the pore 15 is physically pressed by the pressure to be deformed in shape, and such phenomenon affects the change in the surface roughness of the polishing surface 11.

In an embodiment, the plurality of pores 15 included in the polishing variable layer 101 have an average size of about 5 μm to about 50 μm, for example, about 5 μm to about 40 μm, for example, from about 10 μm to about 40 μm, or, for example, from about 10 μm to about 35 μm. When the plurality of pores satisfy the above-mentioned size, it may be advantageous for the first polishing variability index according to Equation 1 to satisfy the above range, and accordingly, it can be more advantageous in terms of realization of the target polishing performance itself and uniform performance throughout the lifespan of the polishing variable layer. The average size of the plurality of pores 15 is a two-dimensional value, and based on the number average value of the pore diameters measured on the projection image taken by photographing the size of the pores exposed to the outside of one surface with an imaging means, such as a scanning electron microscope (SEM), a transmission electron microscope (TEM) or the like, based on the lifespan introduction time of the polishing variable layer 101.

The preliminary composition may further include a blowing agent. The blowing agent may include one selected from the group consisting of a solid phase blowing agent, a gas phase blowing agent, a liquid phase blowing agent, and combinations thereof, as a component for forming the pore structure in the polishing variable layer 101. In an embodiment, the blowing agent may include a solid phase blowing agent, a gas phase blowing agent, or combinations thereof.

The solid phase blowing agent may include expandable particles. The expandable particles may be particles characterized by being capable of expand by heat or pressure, and the final pore size may be determined by heat, pressure or the like applied in the process of preparing the polishing variable layer 101. The expandable particles may include thermally expanded particles, unexpanded particles, or combinations thereof. The 'thermally expanded' particles are particles pre-expanded by heat, and refer to particles having little or no size change due to heat or pressure applied during the preparing process of the polishing variable layer. The 'unexpanded' particles are particles that are not pre-expanded, and refer to particles whose final sizes are determined by the expansion caused by heat or pressure applied during the preparing process of the polishing layer.

The average particle diameter of the expandable particles may be from about 5 μm to about 200 μm, for example, from about 20 μm to about 50 μm, for example, from about 21 μm to about 50 μm, or, for example, from about 21 μm to about 40 μm. The average particle diameter of the expandable particles may refer to the average particle diameter of the thermally expanded particles themselves in the case of the thermally expanded particles, and refer to the average particle diameter of the particles after being expanded by heat or pressure in the case of the unexpanded particles.

The expandable particles may include an outer shell made of a resin material, and an expansion-inducing component present in the inside sealed by the outer shell.

For example, the outer shell may include a thermoplastic resin, and the thermoplastic resin may be one or more kinds selected from the group consisting of vinylidene chloride-based copolymer, acrylonitrile-based copolymer, methacrylonitrile-based copolymer, and acrylic copolymer.

The expansion-inducing component may include one selected from the group consisting of hydrocarbon compounds, chlorofluoro compounds, tetraalkylsilane compounds, and combinations thereof.

Specifically, the hydrocarbon compound may include one selected from the group consisting of ethane, ethylene, propane, propene, n-butane, isobutene, n-butene, isobutene, n-pentane, isopentane, neopentane, n-hexane, heptane, petroleum ether, and combinations thereof.

The chlorofluoro compound may include one selected from the group consisting of trichlorofluoromethane (CCl$_3$F), dichlorodifluoromethane (CCl$_2$F$_2$), chlorotrifluoromethane (CClF$_3$), tetrafluoroethylene (CClF$_2$—CClF$_2$), and combinations thereof.

The tetraalkylsilane compound may include one selected from the group consisting of tetramethylsilane, trimethylethylsilane, trimethylisopropylsilane, trimethyl-n-propylsilane, and combinations thereof.

The solid phase blowing agent may optionally include particles treated with an inorganic component. For example, the solid phase blowing agent may include expandable particles treated with an inorganic component. In an embodiment, the solid phase blowing agent may include expandable particles treated with silica ($SiO2$) particles. The inorganic component treatment of the solid phase blowing agent can prevent aggregation between a plurality of particles. The chemical, electrical, and/or physical characteristics of the surface of the inorganic component-treated solid phase blowing agent may differ from those of a solid phase blowing agent not treated with the inorganic component.

The solid phase blowing agent may be from about 0.5 parts by weight to about 10 parts by weight, for example, from about 1 part by weight to about 3 parts by weight, for example, from about 1.3 parts by weight to about 2.7 parts by weight, or, for example, from about 1.3 parts by weight to about 2.6 parts by weight, based on 100 parts by weight of the urethane-based prepolymer.

The gas phase blowing agent may include an inert gas. The gas phase blowing agent may be used as a pore-forming element by being added during a reaction between the urethane-based prepolymer and the curing agent.

Although the kind of the inert gas is not particularly limited as long as it does not participate in the reaction between the urethane-based prepolymer and the curing agent, the inert gas may include, for example, one selected from the group consisting of nitrogen gas ($N_2$), argon gas (Ar), helium gas (He), and combinations thereof. Specifically, the inert gas may include nitrogen gas ($N_2$) or argon gas (Ar).

In an embodiment, the blowing agent may include a solid phase blowing agent. For example, the blowing agent may consist of only a solid phase blowing agent.

The solid phase blowing agent may include expandable particles, and the expandable particles may include thermally expanded particles. For example, the solid phase blowing agent may consist of the thermally expanded particles only. When it consists of only the thermally expanded particles without including any non-expanded particles, the variability of the pore structure may be lowered, but the predictability can be increased, so it can be advantageous for implementing uniform pore characteristics across the entire region of the polishing variable layer.

In an embodiment, the thermally expanded particles may be particles having an average particle diameter of about 5 µm to about 200 µm. The average particle diameter of the thermally expanded particles may be from about 5 µm to about 100 µm, for example, from about 10 µm to about 80 µm, for example, from about 20 µm to about 70 µm, for example, from about 20 µm to about 50 µm, for example, from about 30 µm to about 70 µm, for example, from about 25 µm to 45 µm, for example, from about 40 µm to about 70 µm, or, for example, from about 40 µm to about 60 µm. The average particle diameter is defined as the D50 of the thermally expanded particles.

In an embodiment, the density of the thermally expanded particles may be from about 30 kg/m³ to about 80 kg/m³, for example, from about 35 kg/m³ to about 80 kg/m³, for example, from about 35 kg/m³ to about 75 kg/m³, for example, from about 38 kg/m³ to about 72 kg/m³, for example, from about 40 kg/m³ to about 75 kg/m³, or, for example, from about 40 kg/m³ to about 72 kg/m³.

In an embodiment, the blowing agent may include a gas phase blowing agent. For example, the blowing agent may include a solid phase blowing agent and a gas phase blowing agent. Descriptions regarding the solid phase blowing agent are the same as described above.

The gas phase blowing agent may include nitrogen gas.

The gas phase blowing agent may be injected through a predetermined injection line during the process of mixing the urethane-based prepolymer, the solid phase blowing agent, and the curing agent with one another. The injection rate of the gas phase blowing agent may be from about 0.8 L/min to about 2.0 L/min, for example, from about 0.8 L/min to about 1.8 L/min, for example, from about 0.8 L/min to about 1.7 L/min, for example, from about 1.0 L/min to about 2.0 L/min, for example, from about 1.0 L/min to about 1.8 L/min, or, for example, from about 1.0 L/min to about 1.7 L/min.

The composition for preparing the polishing variable layer may further include other additive, such as a surfactant, a reaction rate controlling agent, or the like. The names such as 'surfactant' and 'reaction rate controlling agent' are arbitrary names called on the basis of the main role of the corresponding substance, and each corresponding substance does not necessarily perform only a function limited to the role by the corresponding name.

The surfactant is not particularly limited as long as it is a substance serving to prevent aggregation or overlapping of pores. For example, the surfactant may include a silicone-based surfactant.

The surfactant may be used in a content of about 0.2 parts by weight to about 2 parts by weight based on 100 parts by weight of the urethane-based prepolymer. Specifically, the surfactant may be included in a content of about 0.2 parts by weight to about 1.9 parts by weight, for example, about 0.2 parts by weight to about 1.8 parts by weight, for example, about 0.2 parts by weight to about 1.7 parts by weight, for example, about 0.2 parts by weight to about 1.6 parts by weight, for example, about 0.2 parts by weight to about 1.5 parts by weight, or, for example, about 0.5 parts by weight to 1.5 parts by weight, with respect to 100 parts by weight of the urethane-based prepolymer. When the surfactant is used in a content within the above range, it may be advantageous for the pores derived from the gas phase blowing agent to be stably formed and maintained in the curing mold.

The reaction rate controlling agent may serve to promote or retard the reaction, and a reaction accelerator, a reaction retarder, or both may be used depending on the purpose.

The reaction rate controlling agent may include a reaction accelerator. For example, the reaction accelerator may include one selected from the group consisting of tertiary amine-based compounds, organometallic compounds, and combinations thereof.

Specifically, the reaction rate controlling agent may include one selected from the group consisting of triethylenediamine, dimethylethanolamine, tetramethylbutanediamine, 2-methyl-triethylenediamine, dimethylcyclohexylamine, triethylamine, triisopropanolamine, 1,4-diazabicyclo(2,2,2)octane, bis(2-methylaminoethyl)ether, trimethylaminoethylethanolamine, N,N,N,N,N"-pentamethyldiethylenetriamine, dimethylaminoethylamine, dimethylaminopropylamine, benzyldimethylamine, N-ethylmorpholine, N,N-dimethylaminoethylmorpholine, N,N-dimethylcyclohexylamine, 2-methyl-2-azanovonein, dibutyltin dilaurate, stannous octoate, dibutyltin diacetate, dioctyltin diacetate, dibutyltin maleate, dibutyltin di-2-ethylhexanoate, dibutyltin dimercaptide, and combinations thereof. In an embodiment, the reaction rate controlling agent may include one selected from the group consisting of benzyldimethylamine, N,N-dimethylcyclohexylamine, triethylamine, and combinations thereof.

The reaction rate controlling agent may be used in an amount of about 0.05 parts by weight to about 2 parts by weight based on 100 parts by weight of the urethane-based prepolymer. Specifically, the reaction rate controlling agent may be used in an amount of about 0.05 parts by weight to about 1.8 parts by weight, for example, about 0.05 parts by weight to about 1.7 parts by weight, for example, about 0.05 parts by weight to about 1.6 parts by weight, for example, about 0.1 parts by weight to about 1.5 parts by weight, for example, about 0.1 parts by weight to about 0.3 parts by weight, for example, about 0.2 parts by weight to about 1.8 parts by weight, for example, about 0.2 parts by weight to about 1.7 parts by weight, for example, about 0.2 parts by weight to about 1.6 parts by weight, for example, from about 0.2 parts by weight to about 1.5 parts by weight, or, for example, about 0.5 parts by weight to about 1 part by weight, with respect to 100 parts by weight of the urethane-based prepolymer. When the reaction rate controlling agent is used in a content within the aforementioned range, it can be advantageous for controlling the curing reaction rate of the second composition, so that the polishing variable layer has pores of a desired size and hardness of a desired magnitude.

When the polishing variable layer 101 includes the cured product of the preliminary composition derived from an appropriately selected compound, it is possible to realize polishing variability corresponding to the values of Equations 1 to 3 above, and an improved polishing result can be obtained by imparting appropriate physical/mechanical properties when realizing the polishing performance of the polishing pad as a whole together with other stacked structures such as the polishing constant layer 102.

As described above, the polishing constant layer 102 may be made of a material different from that of the polishing variable layer 101. For example, the polishing constant layer 102 may include a thermoplastic resin. When the polishing constant layer 102 includes a thermoplastic resin, unlike the polishing variable layer 101 including a thermosetting resin, it can be more advantageous for achieving the desired physical/mechanical properties through the laminated structure of the polishing variable layer 101 and the polishing constant layer 102, and by increasing the recyclability of some components of the polishing pad 110, it is possible to obtain the effect of improving not only the intrinsic polishing performance but also the environment-friendliness.

The thermoplastic resin may include one selected from the group consisting of polyethylene (PE), polypropylene (PP), polystyrene (PS), polyvinylchloride (PVC), thermoplastic polyurethane (TPU), and combinations thereof.

In an embodiment, the thermoplastic resin may include a thermoplastic polyurethane (TPU). The TPU is not particularly limited, but may include, for example, a reaction product of an aromatic isocyanate component and a polyol component.

The aromatic isocyanate compound may include, for example, one selected from the group consisting of 2,4-toluenediisocyanate (2,4-TDI), 2,6-toluenediisocyanate (2,6-TDI), naphthalene-1,5-diisocyanate, p-phenylenediisocyanate, tolidinediisocyanate, 4,4'-diphenylmethanediisocyanate, and combinations thereof.

The polyol compound may include, for example, one selected from the group consisting of polyether polyol, polyester polyol, polycarbonate polyol, acryl polyol, and combinations thereof.

The polyol component of the thermoplastic resin may not include an alcohol compound having three or more hydroxyl groups (—OH) per molecule. Putting it differently, the polyol component of the thermoplastic resin may consist of a glycol having two hydroxyl groups (—OH) per molecule, or of a diol compound.

The polyol component of the thermoplastic resin may have a weight average molecular weight (Mw) of about 80 g/mol to about 1000 g/mol, for example, about 90 g/mol to about 800 g/mol.

The polyol compound may include one selected from the group consisting of, for example, polytetramethylene ether glycol (PTMG), polypropylene ether glycol, ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-1,5-pentanediol, 1,6-hexanediol, diethylene glycol (DEG), dipropylene glycol (DPG), tripropylene glycol, polypropylene glycol, and combinations thereof.

In an embodiment, the thermoplastic resin may include a reaction product of a composition including about 80 parts by weight to about 130 parts by weight in total of the polyol component, for example, about 80 parts by weight to about 125 parts by weight, or, for example, about 85 parts by weight to about 120 parts by weight, with respect to 100 parts by weight of the aromatic isocyanate component.

In an embodiment, the aromatic isocyanate component may include 4,4'-diphenylmethanediisocyanate, and the polyol component may include 1,4-butanediol and polytetramethylene ether glycol (PTMG).

For example, the thermoplastic resin may include the reaction product of the composition having about 10 parts by weight to about 30 parts by weight of the 1,4-butanediol, for example, about 10 parts by weight to about 25 parts by weight, or, for example, about 12 parts by weight to about 20 parts by weight, with respect to 100 parts by weight of the 4,4'-diphenylmethanediisocyanate.

For example, the thermoplastic resin may include the reaction product of the composition having about 70 parts by weight to about 120 parts by weight of the polytetramethylene ether glycol (PTMG), for example, greater than about 70 parts by weight and less than about 120 parts by weight, with respect to 100 parts by weight of the 4,4'-diphenylmethanediisocyanate.

As described above, in the polishing layer 10, the ratio of Shore D hardness of the polishing variable layer 101 and the polishing constant layer 102 may be from about 0.50 to about 1.50. FIG. 1 shows, for example, a case in which there is one separable interface 13 between the first surface 11 and the second surface 12. Referring to it, the ratio of Shore D hardness of the two adjacent layers 101 and 102 with respect to the separable interface 13, that is, the polishing variable layer 101 and the polishing constant layer 102, may be from about 0.50 to about 1.50. The ratio of Shore D hardness may be, for example, from about 0.50 to about 1.50, for example, from about 0.60 to about 1.50, for example, from about 0.70 to about 1.40, or, for example, from about 0.80 to about 1.20. When the polishing variable layer 101 and the polishing constant layer 102 each satisfy the above-described material characteristics and, at the same time, satisfy such hardness relative ratio, appropriate elasticity and strength can be transferred to the polishing object through the first surface 11, and it can be more advantageous for realizing a desired polishing performance.

FIG. 3 schematically shows a cross-section of the polishing pad 110 according to an embodiment. Referring to FIG. 3, the polishing pad 110 may further include a cushion layer 20 on one surface of the polishing layer 10. In this case, the second surface 12 of the polishing layer 10 may serve as an attachment surface for the cushion layer 20.

The cushion layer 20, which is a layer that imparts shock absorption capability to the polishing pad 110, may have an Asker C hardness of about 65 to about 75, for example, about 70 to about 75. In an embodiment, the ratio (Hc/Hp) of the Asker C hardness (Hc) of the cushion layer 20 to the Shore D hardness (Hp) of the polishing layer 10 may be from about 1.00 to about 1.55, for example, from about 1.25 to about 1.55, or, from about 1.27 to about 1.55.

When considering a method for preparing a semiconductor device to be described later, the polishing process proceeds while bringing the polished surface of the semiconductor substrate as the polishing object into direct or indirect contact with the first surface 11 as the polishing surface of the polishing layer 10, and at this time, a predetermined pressing condition may be applied according to the polishing purpose. The cushion layer 20 can provide an appropriate elastic force in the thickness direction of the polishing pad 110 to minimize the occurrence of defects such as scratches on the polished surface during the polishing process performed under such pressing conditions, and can contribute to greatly improving the polishing flatness of the polished surface. When the ratio of the Shore D hardness of the polishing layer 10 and the Asker C hardness of the cushion layer 20 satisfies the above-described range, these technical effects can be maximized.

The cushion layer 20 may include a non-woven fabric or suede, but is not limited thereto.

In an embodiment, the cushion layer 20 may include a non-woven fabric. The 'non-woven fabric' refers to a three-dimensional network structure of non-woven fibers. Specifically, the cushion layer 20 may include a nonwoven fabric and a resin impregnated in the non-woven fabric.

The non-woven fabric may be, for example, a non-woven fabric of fibers including one selected from the group consisting of polyester fibers, polyamide fibers, polypropylene fibers, polyethylene fibers, and combinations thereof.

The resin impregnated into the non-woven fabric may include, for example, one selected from the group consisting of a polyurethane resin, a polybutadiene resin, a styrene-butadiene copolymer resin, a styrene-butadiene-styrene copolymer resin, an acrylonitrile-butadiene copolymer resin, a styrene-ethylene-butadiene-styrene copolymer resin, a silicone rubber resin, a polyester-based elastomer resin, a polyamide-based elastomer resin, and combinations thereof.

In an embodiment, the cushion layer 20 may include a non-woven fabric of fibers including polyester fibers impregnated with a resin including a polyurethane resin.

In an embodiment, the cushion layer 20 may have a thickness of about 0.5 mm to about 2.5 mm, for example, about 0.8 mm to about 2.5 mm, for example, about 1.0 mm to about 2.5 mm, for example, from about 1.0 mm to about 2.0 mm, or, for example, from about 1.0 mm to about 1.8 mm.

Referring to FIG. 3, the polishing pad 110 according to an embodiment may further include a first adhesive layer 30 for attaching the polishing layer 10 and the cushion layer 20. The first adhesive layer 30 may include, for example, a heat-sealing adhesive. Specifically, the first adhesive layer 30 may include one selected from the group consisting of a urethane-based adhesive, a silicone-based adhesive, an acrylic adhesive, and combinations thereof, but is not limited thereto.

Referring to FIG. 3, the polishing pad 110 may further include a second adhesive layer 40 for attaching a surface plate. The second adhesive layer 40 may be a media layer for attaching the polishing pad 110 and the surface plate of a polishing apparatus, and may be derived from, for example, a pressure-sensitive adhesive (PSA), but is not limited thereto.

The polishing pad 110 may have a Shore D hardness of about 45 to about 70 of the polishing surface with respect to the entire laminated structure, for example, about 45 to about 65, for example, greater than about 45 and about 65 or less, or, for example, about 50 to about 60. The combination of respective layers constituting the polishing pad 110 synthetically realizes the hardness within the above range, thereby minimizing the occurrence of defects such as scratches on the polished surface, and being advantageous for improving the polishing flatness of the polished surface.

The ratio (Ht/Hp) of the Shore D hardness (Ht) of the entire laminated structure of the polishing pad 110 to the Shore D hardness (Hp) of the polishing layer 10 may be from about 0.95 to about 1.10, for example, from about 0.96 to about 1.10, or, for example, from about 0.98 to about 1.10. The polishing layer 10 among the entire configuration of the polishing pad 110 is a layer that directly affects the polishing performance, and when the Shore D hardness of the polishing layer 10 itself and the Shore D hardness realized by the entire polishing pad 110 satisfy the above-described relative ratio, it can be more advantageous for realizing a desired polishing performance.

In an embodiment, the compressibility of the polishing pad 110 may be from about 0.4% to about 2.0%, for example, about 0.6% to about 1.6%, for example, about 0.8% to about 1.5%, or, for example, from about 1.0% to about 1.5%. As described above, the polishing pad 110 can realize a compressibility within the above range through a subdivided structural design in the thickness direction, and by transferring a corresponding elastic force to the polished surface through the first surface 11, it is possible to obtain the advantage of maximizing the defect prevention performance.

Hereinafter, a method for preparing the polishing pad 110 will be described.

The polishing pad 110 may be prepared by a preparing method including preparing a polishing layer 10 including a first surface 11 which is a polishing surface, a second surface 12 which is a rear surface opposite to the first surface 11, and at least one separable interface 13 between the first surface 11 and the second surface 12, wherein the preparing of the polishing layer 10 includes: preparing at least one polishing variable layer 101 that is a region from the first surface 11 to the separable interface 13; preparing at least one polishing constant layer 102 that is a region from the separable interface 13 to the second surface 12; and laminating the polishing variable layer 101 and the polishing constant layer 102 using the separable interface 13 as a lamination interface, and wherein the ratio of shore D hardness of the polishing variable layer 101 and the polishing constant layer 102 is from about 0.50 to about 1.50.

Descriptions regarding each of the polishing variable layer 101, the polishing constant layer 102, and the separable interface 13 are all the same as described above regarding the polishing pad 110.

The laminating of the polishing variable layer 101 and the polishing constant layer 102 may be laminating with a double-sided adhesive. The double-sided adhesive is not particularly limited as long as it is capable of mutual adhesion, but may include, for example, one selected from the group consisting of a urethane-based adhesive, a silicone-based adhesive, an acrylic adhesive, and combinations thereof. Accordingly, the lamination interface of the polishing variable layer 101 and the polishing constant layer 102 may serve as the separable interface 13.

The preparing of the polishing variable layer 101 may include preparing a first composition including a urethane-based prepolymer; preparing a second composition including the first composition, a blowing agent and a curing agent; and curing the second composition.

Descriptions regarding the urethane-based prepolymer are the same as those described above regarding the polishing pad 110, and the first composition is a configuration corresponding to the preliminary composition among the descriptions provided above regarding the polishing pad 110, and all descriptions related thereto are the same as described above.

The viscosity of the first composition may be from about 100 cps to about 1,000 cps at about 80° C., for example, from about 200 cps to about 800 cps, for example, from about 200 cps to about 600 cps, for example, from about 200 cps to about 550 cps, or, for example, from about 300 cps to about 500 cps. By satisfying such viscosity range, the preparing process efficiency of the polishing variable layer 101 can be improved, the dispersibility of other components can be increased, and as a result, it can be advantageous for the polishing variable layer 101 to secure appropriate hardness and density.

Descriptions regarding the blowing agent and the curing agent are all the same as described above regarding the polishing pad 110.

When the blowing agent includes a solid phase blowing agent, the preparing of the second composition may include preparing a 1-1 composition by mixing the first composition and the solid phase blowing agent; and mixing the 1-1 composition and the curing agent to prepare a second composition.

The viscosity of the composition 1-1 may be from about 1,000 cps to about 2,000 cps at about 80° C., for example, from about 1,000 cps to about 1,800 cps, for example, from about 1,000 cps to about 1,600 cps, or, for example, from about 1,000 cps to about 1,500 cps. When the viscosity of the composition 1-1 satisfies such a range, it may be advantageous in terms of technical significance similar to that of the viscosity of the first composition.

When the blowing agent includes a gas phase blowing agent, the preparing of the second composition may include preparing a 1-2 composition by mixing the first composition and the curing agent; and injecting the gas phase blowing agent into the 1-2 composition to prepare the second composition.

In an embodiment, the composition 1-2 may further include a solid phase blowing agent.

For example, the injection rate of the gas phase blowing agent may be from about 0.8 L/min to about 2.0 L/min, for example, from about 0.8 L/min to about 1.8 L/min, for example, from about 0.8 L/min to about 1.7 L/min, for example, from about 1.0 L/min to about 2.0 L/min, for example, from about 1.0 L/min to about 1.8 L/min, or, for example, from about 1.0 L/min to about 1.7 L/min.

In an embodiment, the curing of the second composition may include: preparing a mold preheated to a first temperature; injecting the second composition into the preheated mold and curing the same; and post-curing the cured second composition under a second temperature condition higher than the first temperature.

In an embodiment, the temperature difference (T2–T1) between the first temperature (T1) and the second temperature (T2) may be from about 10° C. to about 40° C., for example, from about 10° C. to about 35° C., or, for example, from about 15° C. to about 35° C.

In an embodiment, the first temperature may be from about 60° C. to about 100° C., for example, from about 65° C. to about 95° C., or, for example, from about 70° C. to about 90° C. In an embodiment, the second temperature may be from about 100° C. to about 130° C., for example, from about 100° C. to 125° C., or, for example, from about 100° C. to about 120° C.

When the multi-stage temperature condition as described above is applied to the curing of the second composition, the polishing variable layer 101 prepared through this can be more advantageous in securing desired physical/mechanical properties such as hardness, tensile strength, and elongation rate.

In the curing of the second composition, the injecting of the second composition into the preheated mold to cure the same may be performed for about 5 minutes to about 60 minutes, for example, about 5 minutes to about 40 minutes, for example, about 5 minutes to about 30 minutes, or, for example, about 5 minutes to about 25 minutes.

The post-curing of the cured second composition under the second temperature condition higher than the first temperature may be performed for about 5 hours to about 30 hours, for example, about 5 hours to about 25 hours, for example, about 10 hours to about 30 hours, for example, about 10 hours to about 25 hours, for example, about 12 hours to about 24 hours, or, for example, about 15 hours to about 24 hours.

The method for preparing the polishing pad 110 may further include processing the first surface 11.

The processing of the first surface 11 may include at least one step of (1) forming a groove on the first surface 11; (2) line turning the first surface 11; and (3) roughening the first surface 11.

In the step (1), the groove may include at least one of a concentric groove formed such that its members are spaced apart from each other by a predetermined spacing from the center of the polishing variable layer 101 on the first surface 11 toward the edge; and a radial groove formed such that its members continue from the center of the polishing variable layer 101 on the first surface 11 toward the edge.

In step (2), the line turning may be performed in a way that the first surface 11 is cut by a predetermined thickness with a cutting tool.

In step (3), the roughening may be performed in a way that the first surface 11 is processed with a sanding roller.

The preparing of the polishing constant layer 102 may include preparing a thermoplastic resin raw material; and processing the thermoplastic resin raw material.

The thermoplastic resin raw material may include one selected from the group consisting of polyethylene (PE), polypropylene (PP), polystyrene (PS), polyvinylchloride (PVC), thermoplastic polyurethane (TPU), and combinations thereof.

In an embodiment, the thermoplastic resin raw material may include a composition for preparing thermoplastic polyurethane (TPU). The composition for preparing the TPU is not particularly limited, but may include, for example, an aromatic isocyanate component and a polyol component.

The aromatic isocyanate compound may include, for example, one selected from the group consisting of 2,4-toluenediisocyanate (2,4-TDI), 2,6-toluenediisocyanate (2,6-TDI), naphthalene-1,5-diisocyanate, p-phenylenediisocyanate, tolidinediisocyanate, 4,4'-diphenylmethanediisocyanate, and combinations thereof.

The polyol compound may include, for example, one selected from the group consisting of polyether polyol, polyester polyol, polycarbonate polyol, acryl polyol, and combinations thereof.

The polyol component of the thermoplastic resin raw material may not include an alcohol compound having three or more hydroxyl groups (—OH) per molecule. Putting it differently, the polyol component of the thermoplastic resin raw material may consist of a glycol having two hydroxyl groups (—OH) per molecule, or of a diol compound.

The polyol component of the thermoplastic resin raw material may have a weight average molecular weight (Mw) of about 80 g/mol to about 1000 g/mol, for example, about 90 g/mol to about 800 g/mol.

The polyol compound may include one selected from the group consisting of, for example, polytetramethylene ether glycol (PTMG), polypropylene ether glycol, ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-1,5-pentanediol, 1,6-hexanediol, diethylene glycol (DEG), dipropylene glycol (DPG), tripropylene glycol, polypropylene glycol, and combinations thereof.

In an embodiment, the thermoplastic resin raw material may include about 80 parts by weight to about 130 parts by weight in total of the polyol component, for example, about 80 parts by weight to about 125 parts by weight, or, for example, about 85 parts by weight to about 120 parts by weight, with respect to 100 parts by weight of the aromatic isocyanate component.

In an embodiment, the aromatic isocyanate component may include 4,4'-diphenylmethanediisocyanate, and the polyol component may include 1,4-butanediol and polytetramethylene ether glycol (PTMG).

For example, the thermoplastic resin raw material may include about 10 parts by weight to about 30 parts by weight of the 1,4-butanediol, for example, about 10 parts by weight to about 25 parts by weight, or, for example, about 12 parts by weight to about 20 parts by weight, with respect to 100 parts by weight of the 4,4'-diphenylmethanediisocyanate.

For example, the thermoplastic resin raw material may include about 70 parts by weight to about 100 parts by weight of the polytetramethylene ether glycol (PTMG) with respect to 100 parts by weight of the 4,4'-diphenylmethanediisocyanate.

In an embodiment, the processing of the thermoplastic resin raw material may include injecting the thermoplastic resin raw material into a mold preheated to about 70° C. to about 90° C., and curing the same for about 80 minutes to about 160 minutes; post-curing the cured thermoplastic resin raw material at room temperature of about 20° C. to about 40° C.; and aging the post-cured thermoplastic resin raw material at about 100° C. to about 120° C. for about 10 hours to about 15 hours.

The preheating temperature of the mold may be, for example, from about 70° C. to about 90° C., or, for example, from about 75° C. to about 85° C., and the curing time may be from about 80 minutes to about 160 minutes, for example, from about 100 minutes to about 150 minutes, for example, from about 100 minutes to about 130 minutes, or, for example, from about 110 minutes to about 130 minutes.

In the aging of the thermoplastic resin raw material, the temperature may be from about 100° C. to about 120° C., for example, from about 105° C. to about 115° C., and the time may be from about 10 hours to about 15 hours, for example, from about 10 hours to about 14 hours, for example, from about 10 hours to about 13 hours, or, for example, from about 11 hours to about 13 hours.

As described above, by applying the laminated structure of the polishing variable layer 101 and the polishing constant layer 102 to the polishing layer 10, it is possible to secure the advantage of being able to design precise and various physical properties in the thickness direction of the polishing layer 10, and it is possible to provide excellent polishing performance to the polished surface of the polishing object through the first surface 11 of the polishing variable layer 101.

The method for preparing the polishing pad 110 may further include laminating the cushion layer 20 on the second surface 12 of the polishing layer 10. Descriptions regarding the cushion layer 20 are the same as those described above regarding the polishing pad 110.

In an embodiment, the laminating of the cushion layer 20 may include applying a heat-sealing adhesive on the second surface 12; applying a heat-sealing adhesive on one surface of the cushion layer 20; and laminating the second surface 12 and the cushion layer 20 so that their surfaces on which the heat-sealing adhesives have been applied come in contact with each other; and sealing under pressure or heating conditions.

The heat-sealing adhesive is not particularly limited, but may include, for example, one selected from the group consisting of a urethane-based adhesive, a silicone-based adhesive, an acrylic adhesive, and combinations thereof.

Referring to FIG. 3, the first adhesive layer 30 may be formed on the second surface 12 during the lamination process of the cushion layer 20.

In an embodiment, the method for preparing the polishing pad 110 may further include forming a second adhesive layer 40 on one surface of the cushion layer 20. The second adhesive layer 40, which is a configuration for attaching the polishing pad 110 to the surface plate of the polishing apparatus, may be derived from, for example, a pressure-sensitive adhesive (PSA), but is not limited thereto.

Specifically, in an embodiment, the forming of the second adhesive layer 40 may include: applying a pressure-sensitive adhesive to a surface opposite to the attachment surface of the cushion layer 20 to the second surface 12; and drying the pressure-sensitive adhesive.

In another embodiment, the forming of the second adhesive layer 40 may include: preparing an adhesive film including a pressure-sensitive adhesive; and attaching the adhesive film to a surface opposite to the attachment surface 12 of the cushion layer 20 to the second surface 12.

The polishing pad may be employed in polishing processes for various purposes. For example, the polishing pad may be applied to a preparing process of a semiconductor device. Recently, semiconductor devices are required to have a higher degree of integration and a more three-dimensionally complicated structure. In order to meet such requirements, fine process control is essential in the preparing process of a semiconductor device. The semiconductor device includes various materials and various types of thin films, and thus requires a polishing process to have process conditions finely adjusted according to the material and shape of each thin film. The polishing pad is one of these fine process control factors, and the polishing result of the semiconductor device may vary significantly even by minute differences in the structure, material, and shape of the polishing pad.

As described above, the polishing constant layer 102, which is a region whose physical and/or chemical characteristics do not substantially change during the polishing process, does not directly have an influence on the polished surface of the polishing object, but it is laminated with the polishing variable layer 101, enabling the polishing pad to secure an appropriate level of physical/mechanical performance such as overall structural support performance, elasticity, elongation rate and tensile strength, thereby serving as a configuration that directly or indirectly has an influence on the resulting polishing performance.

In this aspect, since the polishing constant layer 102 includes a cured product of the composition containing a thermosetting polyurethane particles, and a binder, its technical advantages can be maximized.

In an embodiment, the thermosetting polyurethane particles may have an average particle diameter of about 20 μm to about 3.0 mm. For example, the thermosetting polyurethane particles may have a particle diameter of about 50 μm to about 2.0 mm, for example, about 100 μm to about 2.0 mm, or, for example, about 500 μm to about 2.0 mm. The 'average particle diameter' is a number average value of diameters measured based on cross sections of the particles, and may be obtained from a two-dimensional projection image of the particles. A method for obtaining the projected image is not particularly limited, but it may be obtained using, for example, a scanning electron microscope (SEM) or a transmission electron microscope (TEM). Applying the particles of this size can improve the support rigidity of the polishing constant layer 102, and contribute to securing long-term durability of the polishing variable layer 101.

In an embodiment, the thermosetting polyurethane particles may be particles derived from a polishing pad waste including thermosetting polyurethane. Specifically, the thermosetting polyurethane particles may be derived from a pulverized product of the polishing pad waste containing the thermosetting polyurethane. The 'polishing pad waste' may refer to a polishing pad discarded after being used in a desired polishing process, or a by-product thrown away in the process of preparing the polishing pad. In general, a polishing pad is a semi-permanent process component, and is a component which must be replaced after being applied to the polishing process for a predetermined period of time because its physical structure and/or chemical properties are no longer suitable for the polishing. In addition, since the polishing pad must provide a polishing surface that meets the polishing purpose, only a portion that can ensure the quality and stability of the polishing object is adopted and used during the preparing process, and the remaining portion is frequently discarded as by-products. In the case where the used polishing pad or the by-product discarded during the preparing process includes the thermosetting polyurethane, it becomes the main culprit of environmental pollution because there is practically no recyclability. Furthermore, as the demand for semiconductors increases in recent years, the quantity of polishing pads discarded after being applied to semiconductor processes, and polishing pad preparing by-products are continuously increasing, which makes the environmental pollution problem more serious. Accordingly, when the polishing pad employs particles derived from waste of the polishing pad as a component of the polishing constant layer 102, it may be more advantageous for achieving the above-described technical purpose and for realizing an eco-friendly effect because they are waste of articles used for the same purpose.

The composition for forming the polishing constant layer may include a binder as well as the thermosetting polyurethane particles.

In an embodiment, the binder may include a first urethane-based prepolymer and a first curing agent. By ensuring uniform dispersibility of the thermosetting polyurethane particles and at the same time ensuring proper physical properties of the polishing constant layer compared to the polishing variable layer, the binder can enable the entire polishing layer to implement optimized polishing performance.

The first urethane-based prepolymer may include a reaction product of a first polyol compound and a first isocyanate compound. In the first urethane-based prepolymer, the 'prepolymer' refers to a polymer having a relatively low molecular weight in which the polymerization degree is stopped at an intermediate stage to facilitate molding in the preparing of a cured product. The prepolymer itself undergoes an additional curing process, such as heating, pressurization or/and the like, or may be mixed with another polymerizable compound, for example, an additional compound such as a heterogeneous monomer or a heterogeneous prepolymer, and reacted, and then may be molded into a final cured product.

The first isocyanate compound may use one selected from the group consisting of aromatic diisocyanate, aliphatic diisocyanate, cycloaliphatic diisocyanate, and combinations thereof. For example, the isocyanate compound may include aromatic diisocyanate. For example, the isocyanate compound may include aromatic diisocyanate and cycloaliphatic diisocyanate.

The first isocyanate compound may include, for example, one selected from the group consisting of 2,4-toluenediisocyanate (2,4-TDI), 2,6-toluenediisocyanate (2,6-TDI), naphthalene-1,5-diisocyanate, p-phenylenediisocyanate, tolidinediisocyanate, 4,4'-diphenylmethanediisocyanate, hexamethylenediisocyanate, dicyclohexylmethanediisocyanate, 4,4'-dicyclohexylmethanediisocyanate ($H_{12}$MDI), isophorone diisocyanate, and combinations thereof.

In the first polyol compound, the 'polyol' refers to a compound containing at least two or more hydroxyl groups (—OH) per molecule. In an embodiment, the polyol compound may include a dihydric alcohol compound having two hydroxyl groups, that is, diol or glycol; or a trihydric alcohol compound having three hydroxyl groups, that is, a triol compound.

The first polyol compound may include, for example, one selected from the group consisting of polyether polyol, polyester polyol, polycarbonate polyol, acryl polyol, and combinations thereof.

The first polyol compound may include one selected from the group consisting of, for example, polytetramethylene ether glycol (PTMG), polypropylene ether glycol, ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-1,5-pentanediol, 1,6-hexanediol, diethylene glycol (DEG), dipropylene glycol (DPG), tripropylene glycol, polypropylene glycol, polypropylene triol, and combinations thereof.

The first polyol compound may have a weight average molecular weight (Mw) of about 100 g/mol to about 3,000 g/mol, for example, about 100 g/mol to about 2,000 g/mol, or, for example, about 100 g/mol to about 1,800 g/mol.

In an embodiment, the first polyol compound may include a low molecular weight polyol having a weight average molecular weight (Mw) of about 100 g/mol or more and less than about 300 g/mol, and a high molecular weight polyol having a weight average molecular weight (Mw) of about 300 g/mol or more and about 1800 g/mol or less. The weight average molecular weight (Mw) of the high molecular weight polyol may be, for example, about 500 g/mol or more, and about 1,800 g/mol or less, or, for example, about 700 g/mol or more, and about 1,800 g/mol or less. In this case, the first polyol compound can form an appropriate cross-linked structure in the first urethane-based prepolymer, and the polishing constant layer through the binder including the first urethane-based prepolymer can be more advantageous in terms of support performance and elastic force.

The first urethane-based prepolymer may have a weight average molecular weight (Mw) of about 500 g/mol to about 3,000 g/mol, for example, about 600 g/mol to about 2,000 g/mol, or, for example, about 800 g/mol to about 1,000 g/mol. When the first urethane-based prepolymer has a degree of polymerization corresponding to the aforementioned weight average molecular weight (Mw), the binder can be more advantageous in terms of improving the dispersibility of the thermosetting polyurethane particles in the polishing constant layer.

In an embodiment, the first isocyanate compound may include an aromatic diisocyanate. The aromatic diisocyanate may include, for example, 2,4-toluene diisocyanate (2,4-TDI), or may include, for example, 2,4-toluene diisocyanate (2,4-TDI) and 2,6-toluenediisocyanate (2,6-TDI). Additionally, the first polyol compound may include, for example, polytetramethylene ether glycol (PTMG) and diethylene glycol (DEG).

In another embodiment, the first isocyanate compound may include aromatic diisocyanate and cycloaliphatic diisocyanate. The aromatic diisocyanate may include, for example, 2,4-toluene diisocyanate (2,4-TDI), or may include, for example, 2,4-toluene diisocyanate (2,4-TDI) and 2,6-toluenediisocyanate (2,6-TDI). The cycloaliphatic diisocyanate may include, for example, 4,4'-dicyclohexylmethane diisocyanate ($H_{12}$MDI). Additionally, the first polyol compound may include, for example, polytetramethylene ether glycol (PTMG) and diethylene glycol (DEG).

In an embodiment, based on 100 parts by weight of the total weight of the first isocyanate compound, the total weight of the first polyol compound may be from about 100 parts by weight to about 180 parts by weight, for example, greater than about 100 parts by weight and up to about 180 parts by weight, for example, from about 110 parts by weight to about 160 parts by weight, or, for example, from about 120 parts by weight to about 150 parts by weight.

In another embodiment, based on 100 parts by weight of the total weight of the first isocyanate compound, the total weight of the first polyol compound may be greater than about 180 parts by weight and up to about 250 parts by weight, for example, from about 185 parts by weight to about 250 parts by weight, or, for example, from about 190 parts by weight to about 240 parts by weight.

In an embodiment, the first polyol compound may include polytetramethylene ether glycol (PTMG), and the content of the polytetramethylene ether glycol (PTMG) may be from about 100 parts by weight to about 250 parts by weight, for example, greater than about 100 parts by weight and up to about 250 parts by weight, for example, from about 110 parts by weight to about 220 parts by weight, or, for example, from about 110 parts by weight to about 140 parts by weight, with respect to 100 parts by weight of the total weight of the first isocyanate compound.

In another embodiment, the first polyol compound may include polytetramethylene ether glycol (PTMG), and the content of the polytetramethylene ether glycol (PTMG) may be from about 150 parts by weight to about 250 parts by weight, for example, from about 180 parts by weight to about 230 parts by weight, with respect to 100 parts by weight of the total weight of the first isocyanate compound.

In an embodiment, the first polyol compound may include diethylene glycol (DEG), and the content of the diethylene glycol (DEG) may be from about 1 part by weight to about 20 parts by weight, for example, from about 1 part by weight to about 15 parts by weight, with respect to 100 parts by weight of the total weight of the first isocyanate compound.

In an embodiment, the first isocyanate compound may include the aromatic diisocyanate, and the aromatic diisocyanate may include 2,4-TDI and 2,6-TDI, and the content of 2,6-TDI may be from about 1 part by weight to about 40 parts by weight, for example, from about 1 part by weight to about 30 parts by weight, for example, from about 3 parts by weight to about 28 parts by weight, or, for example, about 20 parts by weight to about 30 parts by weight, with respect to 100 parts by weight of the 2,4-TDI.

In another embodiment, the content of 2,6-TDI may be from about 1 part by weight to about 40 parts by weight, for example, from about 1 part by weight to about 30 parts by weight, for example, from about 1 part by weight to about 20 parts by weight, or, for example, about 1 part by weight to about 10 parts by weight, with respect to 100 parts by weight of the 2,4-TDI.

In an embodiment, the first isocyanate compound may include the aromatic diisocyanate and the cycloaliphatic diisocyanate, and the content of the cycloaliphatic diisocyanate may be from about 5 parts by weight to about 30 parts by weight, for example, about 10 parts by weight to about 25 parts by weight, with respect to total 100 parts by weight of the aromatic diisocyanate.

When the first urethane-based prepolymer satisfies the above-described compositional characteristics, the binder can realize excellent dispersibility of the thermosetting polyurethane particles. In addition, as the thermosetting polyurethane particles and the binder are firmly bound to each other at their interfaces, it may be more advantageous in terms of securing overall support rigidity and elastic force of the polishing constant layer.

The binder may include a first curing agent. The first curing agent can chemically react with the first urethane-based prepolymer to form an appropriate cross-linked structure, thereby securing the excellent dispersibility of the thermosetting polyurethane particles and the proper mechanical rigidity of the polishing constant layer at an appropriate level at the same time.

In an embodiment, the first curing agent may include a compound including one reactive group selected from the group consisting of an amine group (—$NH_2$), an alcohol group (—OH), and combinations thereof. The 'reactive group' refers to a terminal functional group that directly participates in a chemical reaction when the first curing agent reacts with a heterogeneous compound such as the first urethane-based prepolymer. That is, the first curing agent may include, for example, a compound containing an amine group (—$NH_2$) as a reactive group in one molecule, or a compound containing an alcohol group (—OH) as a reactive group in one molecule, or a compound containing both an amine group (—$NH_2$) and an alcohol group (—OH) as a reactive group in one molecule.

For example, the first curing agent may include one selected from the group consisting of 4,4'-methylenebis(2-chloroaniline) (MOCA), diethyltoluenediamine (DETDA), diaminodiphenylmethane, dimethyl thio-toluene diamine (DMTDA), propanediol bis p-aminobenzoate, methylene bis-methylanthranilate, diaminodiphenylsulfone, m-xylylenediamine, isophoronediamine, ethylenediamine, diethylenetriamine, triethylenetetramine, polypropylenediamine, polypropylenetriamine, bis(4-amino-3-chlorophenyl)methane, triethanolamine, tripropanolamine, triisopropanolamine, and combinations thereof.

The content of the first curing agent among 100 wt % in total of the binder may be about 15 wt % to about 30 wt %, for example, about 18 wt % to about 27 wt %, for example, from about 19 wt % to about 26 wt %, or, for example, from about 20 wt % to about 26 wt %. Applying the first curing agent in such an amount may be more advantageous for realizing the technical performance of the binder.

The composition for forming the polishing constant layer may include about 15 parts by weight to about 150 parts by weight of the thermosetting polyurethane particles, for example, about 20 parts by weight to about 120 parts by weight, or, for example, about 40 parts by weight to about 110 parts by weight, with respect to 100 parts by weight of the binder. When the relative content ratio of the binder and the thermosetting polyurethane particles satisfy the above-mentioned range, the thermosetting polyurethane particles can be uniformly dispersed, and be firmly bound in the polishing constant layer, so that it can be advantageous for improving overall durability.

The composition for forming the polishing constant layer may further include a first blowing agent as needed. The first blowing agent may serve to adjust density and elasticity by imparting a pore structure to the polishing constant layer. The first blowing agent may include, for example, one selected from the group consisting of a solid phase blowing agent, a gas phase blowing agent, a liquid phase blowing agent, and combinations thereof.

When the composition for forming the polishing constant layer includes the first blowing agent, it may include about 0.1 parts by weight to about 10 parts by weight of the first blowing agent with respect to 100 parts by weight of the thermosetting polyurethane particles.

The polishing variable layer 101 may be a region in which the thermosetting polyurethane particles are not included, unlike the polishing constant layer 102. That is, the polishing variable layer 101 may be a region devoid of the thermosetting polyurethane particles. By configuring the polishing variable layer 101 differently from the polishing constant layer 102 in terms of the provision of the thermosetting polyurethane particles, the polishing pad 110 can be realized such that its physical properties can be more precisely subdivided in the thickness direction, thereby realizing various polishing performances according to various uses and purposes.

In an embodiment, the polishing variable layer 101 may include a cured product of the composition including the second urethane-based prepolymer. In the second urethane-based prepolymer, the 'prepolymer' refers to a polymer having a relatively low molecular weight in which the polymerization degree is stopped at an intermediate stage to facilitate molding in the preparing of a cured product. The prepolymer itself undergoes an additional curing process, such as heating, pressurization or/and the like, or may be mixed with another polymerizable compound, for example, an additional compound such as a heterogeneous monomer or a heterogeneous prepolymer, and reacted, and then may be molded into a final cured product.

In an embodiment, the second urethane-based prepolymer may include a reaction product of the second isocyanate compound and the second polyol compound. The second isocyanate compound and the second polyol compound may include the same compounds as the first isocyanate compound and the first polyol compound, respectively, or may include different compounds.

In an embodiment, the second isocyanate compound may use one selected from the group consisting of aromatic diisocyanate, aliphatic diisocyanate, cycloaliphatic diisocyanate, and combinations thereof. For example, the second isocyanate compound may include aromatic diisocyanate.

For example, the second isocyanate compound may include aromatic diisocyanate and cycloaliphatic diisocyanate.

The second isocyanate compound may include, for example, one selected from the group consisting of 2,4-toluenediisocyanate (2,4-TDI), 2,6-toluenediisocyanate (2,6-TDI), naphthalene-1,5-diisocyanate, p-phenylenediisocyanate, tolidinediisocyanate, 4,4'-diphenylmethanediisocyanate, hexamethylenediisocyanate, dicyclohexylmethanediisocymate, 4,4'-dicyclohexylmethanediisocyanate ($H_{12}$MDI), isophorone diisocyanate, and combinations thereof.

In the second polyol compound, the 'polyol' refers to a compound containing at least two or more hydroxyl groups (—OH) per molecule. In an embodiment, the polyol compound may include a dihydric alcohol compound having two hydroxyl groups, that is, diol or glycol; or a trihydric alcohol compound having three hydroxyl groups, that is, a triol compound.

The second polyol compound may include, for example, one selected from the group consisting of polyether polyol, polyester polyol, polycarbonate polyol, acryl polyol, and combinations thereof.

The second polyol compound may include one selected from the group consisting of, for example, polytetramethylene ether glycol (PTMG), polypropylene ether glycol, ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-1,5-pentanediol, 1,6-hexanediol, diethylene glycol (DEG), dipropylene glycol (DPG), tripropylene glycol, polypropylene glycol, polypropylene triol, and combinations thereof.

The second polyol compound may have a weight average molecular weight (Mw) of about 100 g/mol to about 3,000 g/mol, for example, about 100 g/mol to about 2,000 g/mol, or, for example, about 100 g/mol to about 1,800 g/mol.

In an embodiment, the second polyol compound may include a low molecular weight polyol having a weight average molecular weight (Mw) of about 100 g/mol or more and less than about 300 g/mol, and a high molecular weight polyol having a weight average molecular weight (Mw) of about 300 g/mol or more and about 1800 g/mol or less. The weight average molecular weight (Mw) of the high molecular weight polyol may be, for example, about 500 g/mol or more, and about 1,800 g/mol or less, or, for example, about 700 g/mol or more, and about 1,800 g/mol or less. In this case, the second polyol compound can form an appropriate cross-linked structure in the second urethane-based prepolymer, and as a result, the polishing variable layer 101 can exhibit appropriate tensile strength, elongation rate, and compressive properties, which can be more advantageous for improving polishing performance through the first surface 11.

The second urethane-based prepolymer may have a weight average molecular weight (Mw) of about 500 g/mol to about 3,000 g/mol, for example, about 600 g/mol to about 2,000 g/mol, or, for example, about 800 g/mol to about 1,000 g/mol. When the second urethane-based prepolymer has a degree of polymerization corresponding to the above-mentioned weight average molecular weight (Mw), the polishing variable layer 101 including the final cured product can exhibit appropriate surface hardness and tensile strength, which can be more advantageous for improving polishing performance through the first surface 11.

In an embodiment, the second isocyanate compound may include an aromatic diisocyanate. The aromatic diisocyanate may include, for example, 2,4-toluene diisocyanate (2,4-TDI), or may include, for example, 2,4-toluene diisocyanate (2,4-TDI) and 2,6-toluenediisocyanate (2,6-TDI). Additionally, the second polyol compound may include, for example, polytetramethylene ether glycol (PTMG) and diethylene glycol (DEG).

In another embodiment, the second isocyanate compound may include aromatic diisocyanate and cycloaliphatic diisocyanate. The aromatic diisocyanate may include, for example, 2,4-toluene diisocyanate (2,4-TDI), or may include, for example, 2,4-toluene diisocyanate (2,4-TDI) and 2,6-toluenediisocyanate (2,6-TDI). The cycloaliphatic diisocyanate may include, for example, 4,4'-dicyclohexyl-methane diisocyanate ($H_{12}$MDI). Additionally, the first polyol compound may include, for example, polytetramethylene ether glycol (PTMG) and diethylene glycol (DEG).

In an embodiment, based on 100 parts by weight of the total weight of the second isocyanate compound, the total weight of the second polyol compound may be from about 100 parts by weight to about 180 parts by weight, for example, greater than about 100 parts by weight and up to about 180 parts by weight, for example, from about 110 parts by weight to about 160 parts by weight, or, for example, from about 120 parts by weight to about 150 parts by weight.

In another embodiment, based on 100 parts by weight of the total weight of the second isocyanate compound, the total weight of the second polyol compound may be greater than about 180 parts by weight and up to about 250 parts by weight, for example, from about 185 parts by weight to about 250 parts by weight, or, for example, from about 190 parts by weight to about 240 parts by weight.

In an embodiment, the second polyol compound may include polytetramethylene ether glycol (PTMG), and the content of the polytetramethylene ether glycol (PTMG) may be from about 100 parts by weight to about 250 parts by weight, for example, greater than about 100 parts by weight and up to about 250 parts by weight, for example, from about 110 parts by weight to about 220 parts by weight, or, for example, from about 110 parts by weight to about 140 parts by weight, with respect to 100 parts by weight of the total weight of the second isocyanate compound.

In another embodiment, the second polyol compound may include polytetramethylene ether glycol (PTMG), and the content of the polytetramethylene ether glycol (PTMG) may be from about 150 parts by weight to about 250 parts by weight, for example, from about 180 parts by weight to about 230 parts by weight, with respect to 100 parts by weight of the total weight of the second isocyanate compound.

In an embodiment, the second polyol compound may include diethylene glycol (DEG), and the content of the diethylene glycol (DEG) may be from about 1 part by weight to about 20 parts by weight, for example, from about 1 part by weight to about 15 parts by weight, with respect to 100 parts by weight of the total weight of the second isocyanate compound.

In an embodiment, the second isocyanate compound may include the aromatic diisocyanate, and the aromatic diisocyanate may include 2,4-TDI and 2,6-TDI, and the content of 2,6-TDI may be from about 1 part by weight to about 40 parts by weight, for example, from about 1 part by weight to about 30 parts by weight, for example, from about 3 parts by weight to about 28 parts by weight, or, for example, about 20 parts by weight to about 30 parts by weight, with respect to 100 parts by weight of the 2,4-TDI.

In another embodiment, the content of 2,6-TDI may be from about 1 part by weight to about 40 parts by weight, for example, from about 1 part by weight to about 30 parts by weight, for example, from about 1 part by weight to about 20 parts by weight, or, for example, about 1 part by weight to about 10 parts by weight, with respect to 100 parts by weight of the 2,4-TDI.

In an embodiment, the second isocyanate compound may include the aromatic diisocyanate and the cycloaliphatic diisocyanate, and the content of the cycloaliphatic diisocyanate may be from about 5 parts by weight to about 30 parts by weight, for example, about 10 parts by weight to about 25 parts by weight, with respect to total 100 parts by weight of the aromatic diisocyanate.

When the second urethane-based prepolymer satisfies the above-described compositional characteristics, physical/mechanical properties for realizing the desired variability of the polishing variable layer can be secured. Additionally, improved processability can be secured in forming additional components such as a groove on the first surface of the polishing variable layer. Further, in terms of the overall structure of the polishing layer laminated with the polishing constant layer, it can be more advantageous for subdividing the physical properties in the thickness direction and, at the same time, securing uniformity optimized for the realization of the polishing performance.

The composition for forming the polishing variable layer may have an isocyanate group content (NCO %) of about 5 wt % to about 11 wt %, for example, about 5 wt % to about 10 wt %. In an embodiment, the isocyanate group content (NCO %) may be from about 5 wt % to about 8.5 wt %, and, in another embodiment, the isocyanate group content (NCO %) may be from about 8.5 wt % to about 10 wt %. The 'isocyanate group content' refers to a percentage of the weight of isocyanate groups (—NCO) present as free reactive groups without urethane reaction in the total weight of the composition for forming the polishing variable layer. The NCO % of the composition for forming the polishing variable layer is defined as a value measured in a state where a second curing agent and a second blowing agent to be described below are excluded. The isocyanate group content (NCO %) of the composition may be designed by synthetically adjusting the kind and content of the monomer for preparing the second urethane-based prepolymer, process conditions such as temperature and pressure of the second urethane-based prepolymer preparing process, and the kind of additive used for preparing the second urethane-based prepolymer. When the isocyanate group content satisfies the aforementioned range, it can be advantageous for the polishing variable layer 101 prepared through the curing of the composition to secure appropriate physical/mechanical characteristics, and when the polishing variable layer is applied in a laminated state with the polishing constant layer 102, it can be advantageous for imparting excellent polishing performance through the first surface 11 to the polishing object.

The composition for preparing the polishing variable layer may further include the second curing agent and the second blowing agent. The second curing agent and the second blowing agent may include the same components as the first curing agent and the first blowing agent, respectively, or may include different components.

In an embodiment, the second curing agent may include a compound including one reactive group selected from the group consisting of an amine group (—$NH_2$), an alcohol group (—OH), and combinations thereof. The 'reactive group' refers to a terminal functional group that directly participates in a chemical reaction when the second curing agent reacts with a heterogeneous compound such as the second urethane-based prepolymer. That is, the second curing agent may include, for example, a compound containing only an amine group (—NH₂) as a reactive group in one molecule, or a compound containing only an alcohol group (—OH) as a reactive group in one molecule, or a compound containing an amine group (—NH₂) and an alcohol group (—OH) as a reactive group in one molecule.

For example, the second curing agent may include one selected from the group consisting of 4,4'-methylenebis(2-chloroaniline) (MOCA), diethyltoluenediamine (DETDA), diaminodiphenylmethane, dimethyl thio-toluene diamine (DMTDA), propanediol bis p-aminobenzoate, methylene bis-methylanthranilate, diaminodiphenylsulfone, m-xylylenediamine, isophoronediamine, ethylenediamine, diethylenetriamine, triethylenetetramine, polypropylenediamine, polypropylenetriamine, bis(4-amino-3-chlorophenyl)methane, triethanolamine, tripropanolamine, triisopropanolamine, and combinations thereof.

In an embodiment, the first curing agent may include a compound containing an alcohol group as a reactive group in one molecule, and the second curing agent may include a compound containing an amine group as a reactive group in one molecule. By applying each of the first curing agent and the second curing agent in this way, excellent interface physical properties of the polishing variable layer and the polishing constant layer can be secured, and the overall physical properties of the polishing layer, which is a laminated structure thereof, can be more advantageous for optimizing the polishing performance.

The content of the second curing agent in the total composition for forming the polishing variable layer may be about 15 wt % to about 30 wt %, for example, about 18 wt % to about 27 wt %, for example, from about 19 wt % to about 26 wt %, or, for example, from about 20 wt % to about 26 wt %. By applying the second curing agent in such content, the polishing variable layer including the cured product of the composition can be advantageous for securing mechanical properties suitable for polishing and appropriate variability.

The molar ratio of isocyanate groups (—NCO) in the composition for forming the polishing variable layer and reactive groups of the second curing agent (NCO:reactive groups) may be from about 1:0.80 to about 1:1.20, for example, from about 1:0.90 to about 1:1.10, for example, from about 1:0.90 to about 1:1.00, or, for example, about 1:90 or more and less than about 1:1.00. For example, when the second curing agent includes a compound containing an amine group as a reactive group in one molecule, the molar ratio of the isocyanate group (—NCO) in the composition and the amine group of the second curing agent (NCO:NH2) can satisfy the aforementioned range. When the molar ratio satisfies the above-described range, an appropriate cross-linked structure can be formed by the chemical reaction of the second urethane-based prepolymer and the second curing agent, and as a result, the polishing variable layer can secure physical/mechanical properties such as tensile strength and elongation rate at an appropriate level to be advantageous for transferring excellent polishing performance to the polished surface of the polishing object through the first surface.

The polishing variable layer 101 may be of a porous structure including a plurality of pores 15. The plurality of pores 15 located on the uppermost surface of the polishing variable layer 101 may expose at least a portion of their interiors to the outside to impart a predetermined surface roughness to the first surface 11. FIG. 2 schematically shows a structural change of the first surface 11 according to an embodiment during a polishing process. Specifically, FIG. 2 is a schematic view schematically showing that a portion of the plurality of pores 15 according to an embodiment, which expose their interiors to the outside of the polishing surface 11, are subjected to the structural change during a polishing process. Referring to FIG. 2, since the plurality of pores 15 are distributed across the polishing variable layer 101, they can continuously contribute to the formation of the surface roughness even if the top surface is gradually cut during the polishing process with the first surface 11. However, as for the pores 15 whose interiors are exposed to the first surface 11, as the polishing process continues to be performed under a predetermined pressure condition, the portion corresponding to the boundary between the first surface 11 and the pore 15 is physically pressed by the pressure to be deformed in shape, and such phenomenon affects the change in the surface roughness of the first surface 11. In this regard, since the polishing layer includes the laminated structure of the polishing variable layer 101 and the polishing constant layer 102, the surface properties produced through the first surface 11 as a result of the interaction of respective layers in the thickness direction can be properly designed, so that they can be advantageous for the first surface 11 to maintain a surface state suitable for polishing for a longer period of time.

In an embodiment, the plurality of pores 15 included in the polishing variable layer 101 have an average size of about 5 μm to about 50 μm, for example, about 5 μm to about 40 μm, for example, from about 10 μm to about 40 μm, or, for example, from about 10 μm to about 35 μm. When the plurality of pores satisfy the above-mentioned size, it may be advantageous for the first polishing variability index according to Equation 1 below to satisfy the corresponding range, and accordingly, it can be more advantageous in terms of realization of the target polishing performance itself and uniform performance throughout the lifespan of the polishing variable layer. The average size of the plurality of pores 15 is a two-dimensional value, and based on the number average value of the pore diameters measured on the projection image taken by photographing the size of the pores exposed to the outside of one surface with an imaging means, such as a scanning electron microscope (SEM), a transmission electron microscope (TEM) or the like, based on the lifespan introduction time of the polishing variable layer 101.

The composition for forming the polishing variable layer may include a second blowing agent. The second blowing agent may include one selected from the group consisting of a solid phase blowing agent, a gas phase blowing agent, a liquid phase blowing agent, and combinations thereof, as a component for forming the pore structure in the polishing variable layer 101. In an embodiment, the second blowing agent may include a solid phase blowing agent, a gas phase blowing agent, or combinations thereof.

The solid phase blowing agent may include expandable particles. The expandable particles may be particles characterized by being capable of expand by heat or pressure, and the final pore size may be determined by heat, pressure or the like applied in the process of preparing the polishing variable layer 101. The expandable particles may include thermally expanded particles, unexpanded particles, or combinations thereof. The 'thermally expanded' particles are particles pre-expanded by heat, and refer to particles having little or no size change due to heat or pressure applied during the preparing process of the polishing variable layer. The 'unexpanded' particles are particles that are not pre-expanded, and refer to particles whose final sizes are determined by the expansion caused by heat or pressure applied during the preparing process of the polishing layer.

The average particle diameter of the expandable particles may be from about 5 μm to about 200 μm, for example, from about 20 μm to about 50 μm, for example, from about 21 μm to about 50 μm, or, for example, from about 21 μm to about 40 μm. The average particle diameter of the expandable particles may refer to the average particle diameter of the thermally expanded particles themselves in the case of the thermally expanded particles, and refer to the average particle diameter of the particles after being expanded by heat or pressure in the case of the unexpanded particles.

The expandable particles may include an outer shell made of a resin material, and an expansion-inducing component present in the inside sealed by the outer shell.

For example, the outer shell may include a thermoplastic resin, and the thermoplastic resin may be one or more kinds selected from the group consisting of vinylidene chloride-based copolymer, acrylonitrile-based copolymer, methacrylonitrile-based copolymer, and acrylic copolymer.

The expansion-inducing component may include one selected from the group consisting of hydrocarbon compounds, chlorofluoro compounds, tetraalkylsilane compounds, and combinations thereof.

Specifically, the hydrocarbon compound may include one selected from the group consisting of ethane, ethylene, propane, propene, n-butane, isobutene, n-butene, isobutene, n-pentane, isopentane, neopentane, n-hexane, heptane, petroleum ether, and combinations thereof.

The chlorofluoro compound may include one selected from the group consisting of trichlorofluoromethane ($CCl_3F$), dichlorodifluoromethane ($CCl_2F_2$), chlorotrifluoromethane ($CClF_3$), tetrafluoroethylene ($CClF_2$—$CClF_2$), and combinations thereof.

The tetraalkylsilane compound may include one selected from the group consisting of tetramethylsilane, trimethylethylsilane, trimethylisopropylsilane, trimethyl-n-propylsilane, and combinations thereof.

The second blowing agent includes a solid phase blowing agent, and the solid phase blowing agent may be used in an amount of about 0.5 parts by weight to about 10 parts by weight, for example, about 1 part by weight to about 3 parts by weight, for example, about 1.3 parts by weight to about 2.7 parts by weight, or, for example, about 1.3 parts by weight to about 2.6 parts by weight, based on 100 parts by weight of the urethane-based prepolymer.

The gas phase blowing agent may include an inert gas. The gas phase blowing agent may be used as a pore-forming element by being added during a reaction between the second urethane-based prepolymer and the second curing agent.

Although the kind of the inert gas is not particularly limited as long as it does not participate in the reaction between the second urethane-based prepolymer and the second curing agent, the inert gas may include, for example, one selected from the group consisting of nitrogen gas ($N_2$), argon gas (Ar), helium gas (He), and combinations thereof. Specifically, the inert gas may include nitrogen gas ($N_2$) or argon gas (Ar).

In an embodiment, the second blowing agent may consist of a solid phase blowing agent only.

In an embodiment, the solid phase blowing agent may include expandable particles, and the expandable particles may include the thermally expanded particles. For example, the expandable particles may consist of the thermally expanded particles only. When the expandable particles do not include the unexpanded particles but consist of the thermally expanded particles only, the variability of the pore structure may be somewhat reduced, but the predictability can be increased, so it can be advantageous for implementing uniform pore characteristics across the entire region of the polishing variable layer.

In an embodiment, the thermally expanded particles may be particles having an average particle diameter of about 5 μm to about 200 μm. The average particle diameter of the thermally expanded particles may be from about 5 μm to about 100 μm, for example, from about 10 μm to about 80 μm, for example, from about 20 μm to about 70 μm, for example, from about 20 μm to about 50 μm, for example, from about 30 μm to about 70 μm, for example, from about 25 μm to 45 μm, for example, from about 40 μm to about 70 μm, or, for example, from about 40 μm to about 60 μm. The average particle diameter may be defined as the D50 of the thermally expanded particles.

In an embodiment, the density of the thermally expanded particles may be from about 30 $kg/m^3$ to about 80 $kg/m^3$, for example, from about 35 $kg/m^3$ to about 80 $kg/m^3$, for example, from about 35 $kg/m^3$ to about 75 $kg/m^3$, for example, from about 38 $kg/m^3$ to about 72 $kg/m^3$, for example, from about 40 $kg/m^3$ to about 75 $kg/m^3$, or, for example, from about 40 $kg/m^3$ to about 72 $kg/m^3$.

In another embodiment, the second blowing agent may include a solid phase blowing agent and a gas phase blowing agent. Descriptions regarding the solid phase blowing agent are the same as described above.

The second blowing agent may include the solid phase blowing agent and the gas phase blowing agent, and the gas phase blowing agent may include nitrogen gas.

The gas phase blowing agent may be injected through a predetermined injection line during the process of mixing the solid phase blowing agent and the second curing agent with the urethane-based prepolymer. The injection rate of the gas phase blowing agent may be from about 0.8 L/min to about 2.0 L/min, for example, from about 0.8 L/min to about 1.8 L/min, for example, from about 0.8 L/min to about 1.7 L/min, for example, from about 1.0 L/min to about 2.0 L/min, for example, from about 1.0 L/min to about 1.8 L/min, or, for example, from about 1.0 L/min to about 1.7 L/min.

The composition for preparing the polishing variable layer may further include other additive, such as a surfactant, a reaction rate controlling agent, or the like. The names such as 'surfactant' and 'reaction rate controlling agent' are arbitrary names called on the basis of the main role of the corresponding substance, and each corresponding substance does not necessarily perform only a function limited to the role by the corresponding name.

The surfactant is not particularly limited as long as it is a substance serving to prevent aggregation or overlapping of pores. For example, the surfactant may include a silicone-based polymer.

When the second composition includes the surfactant, the surfactant may be included in a content of about 0.2 parts by weight to about 2 parts by weight, for example, about 0.2 parts by weight to about 1.9 parts by weight, for example, about 0.2 parts by weight to about 1.8 parts by weight, for example, about 0.2 parts by weight to about 1.7 parts by weight, for example, about 0.2 parts by weight to about 1.6 parts by weight, for example, about 0.2 parts by weight to about 1.5 parts by weight, or, for example, about 0.5 parts by weight to 1.5 parts by weight, with respect to 100 parts by weight of the second urethane-based prepolymer. When the surfactant is used in a content of the above range, it may be advantageous for the pores derived from the gas phase blowing agent to be stably formed and maintained in the curing mold.

The reaction rate controlling agent may serve to promote or retard the reaction, and a reaction accelerator, a reaction retarder, or both may be used depending on the purpose.

The reaction rate controlling agent may include a reaction accelerator. For example, the reaction accelerator may include one selected from the group consisting of tertiary amine-based compounds, organometallic compounds, and combinations thereof.

Specifically, the reaction rate controlling agent may include one selected from the group consisting of triethyl-enediamine, dimethylethanolamine, tetramethylbutanedi-amine, 2-methyl-triethylenediamine, dimethylcyclohex-ylamine, triethylamine, triisopropanolamine, 1,4-diazabicyclo(2,2,2)octane, bis(2-methyl aminoethyl)ether, trimethylaminoethylethanolamine, N,N,N,N,N''-pentameth-yldiethylenetriamine, dimethylaminoethylamine, dimethyl-aminopropylamine, benzyldimethylamine, N-ethylmorpho-line, N,N-dimethylaminoethylmorpholine, N,N-dimethylcyclohexylamine, 2-methyl-2-azanovonein, dibutyltin dilaurate, stannous octoate, dibutyltin diacetate, dioctyltin diacetate, dibutyltin maleate, dibutyltin di-2-eth-ylhexanoate, dibutyltin dimercaptide, and combinations thereof. In an embodiment, the reaction rate controlling agent may include one selected from the group consisting of benzyldimethylamine, N,N-dimethylcyclohexylamine, tri-ethylamine, and combinations thereof.

When the second composition includes the reaction rate controlling agent, the reaction rate controlling agent may be included in an amount of about 0.05 parts by weight to about 2 parts by weight, for example, about 0.05 parts by weight to about 1.8 parts by weight, for example, about 0.05 parts by weight to about 1.7 parts by weight, for example, about 0.05 parts by weight to about 1.6 parts by weight, for example, about 0.1 parts by weight to about 1.5 parts by weight, for example, about 0.1 parts by weight to about 0.3 parts by weight, for example, about 0.2 parts by weight to about 1.8 parts by weight, for example, about 0.2 parts by weight to about 1.7 parts by weight, for example, about 0.2 parts by weight to about 1.6 parts by weight, for example, from about 0.2 parts by weight to about 1.5 parts by weight, or, for example, about 0.5 parts by weight to about 1 part by weight, with respect to 100 parts by weight of the second urethane-based prepolymer. When the reaction rate control-ling agent is used in a content within the aforementioned range, it can be advantageous for controlling the curing reaction rate of the second composition, so that the polishing variable layer has pores of a desired size and hardness of a desired magnitude.

When the components of each of the polishing variable layer and the polishing constant layer, and the contents thereof satisfy the above-mentioned conditions, the polish-ing layer to which the laminated structure of them is applied can realize precisely designed physical properties across the thickness direction. As a result, it is possible to obtain effects that enable mechanical properties such as elasticity and rigidity, which the polishing layer transfers to the polished surface of the polishing object through the first surface, to be optimized in terms of polishing performance such as pol-ishing rate, flatness, defect prevention, and the like.

In another embodiment of the present disclosure, there is provided a method for preparing a semiconductor device, the method including: providing a polishing pad on a surface plate, the polishing pod including a polishing layer with a polishing surface; and polishing a polishing object while rotating the polishing pad and the polishing object relative to each other under a pressure condition, after arranging the polishing object to be in contact with the polishing surface, wherein the polishing layer includes a polishing variable layer including the polishing surface, and a polishing con-stant layer disposed on a rear side of the polishing surface of the polishing variable layer, and wherein the ratio of shore D hardness of the polishing variable layer and the polishing constant layer is 0.50 to 1.50.

Descriptions regarding the polishing pad 110 are all the same as described above. That is, descriptions regarding the polishing layer 10 of the polishing pad 110, the first surface 11, the second surface 12, and the separable interface 13 are all the same as described above regarding the polishing pad 110. When the polishing pad 110 is applied to the method for preparing a semiconductor device, a semiconductor device of excellent quality can be produced under optimum physi-cal property conditions realized by the structural and com-positional characteristics of the polishing pad 110 as described above.

Specifically, the ratio of Shore D hardness of two adjacent layers with respect to the separable interface may be from about 0.50 to about 1.50, for example, from about 0.60 to about 1.50, for example, from about 0.70 to about 1.40, or, for example, from about 0.80 to about 1.20. As described above, through the subdivided design of the polishing pad in the thickness direction, the method for preparing a semi-conductor device to which the polishing pad is applied can secure excellent polishing results in terms of polishing flatness and defect prevention.

In another embodiment of the present disclosure, there is provided a method for preparing a semiconductor device, the method including: providing a polishing pad on a surface plate, the polishing pad including a polishing layer having a first surface which is a polishing surface and a second surface which is a rear surface of the first surface; and polishing a polishing object while rotating the polishing pad and the polishing object relative to each other under a pressure condition, after arranging the polishing object so that a polished surface of the polishing object is in contact with the first surface, wherein the polishing layer includes at least one separable interface between the first surface and the second surface, wherein the polishing layer includes at least one polishing variable layer which is a region from the first surface to the separable interface; and at least one polishing constant layer which is a region from the separable interface to the second side, and wherein the polishing constant layer includes a cured product of a composition containing thermosetting polyurethane particles; and a binder.

When describing the polishing pad and all sub-compo-nents in the method of preparing a semiconductor device, the above-described specific details and technical advantages thereof with respect to the polishing pad are integrated, applied to, and interpreted with the description of the method for preparing a semiconductor device below.

When the polishing pad 110 is applied to the method for preparing a semiconductor device, a semiconductor device of excellent quality can be produced under optimum physi-cal property conditions realized by the structural and com-positional characteristics of the polishing pad 110 as described above.

Specifically, the polishing layer 10 including the lami-nated structure of the polishing variable layer 101 and the polishing constant layer 102 is applied as the polishing pad 110, and the cured product of a composition including thermosetting polyurethane particles and a binder is applied as the polishing constant layer 102, so a detailed design of the thickness direction of the polishing pad 110 is possible, and the method for preparing a semiconductor device to which the polishing pad 110 is applied can secure excellent polishing results in terms of polishing flatness, polishing rate, and defect prevention.

Descriptions regarding the thermosetting polyurethane particles and the binder are all the same as described above regarding the polishing pad 110.

Specifically, in an embodiment, the thermosetting polyurethane particles may have an average particle diameter of about 20 μm to about 3.0 mm, for example, about 50 μm to about 2.0 mm, or, for example, about 100 μm to about 2.0 mm. The 'average particle diameter' is a number average value of diameters measured based on cross sections of the particles, and may be obtained from a two-dimensional projection image of the particles. A method for obtaining the projected image is not particularly limited, but it may be obtained using, for example, a scanning electron microscope (SEM) or a transmission electron microscope (TEM). Applying the particles of this size can improve the support rigidity of the polishing constant layer 102, and contribute to securing long-term durability of the polishing variable layer 101.

In an embodiment, the thermosetting polyurethane particles may be particles derived from a polishing pad waste including thermosetting polyurethane. Specifically, the thermosetting polyurethane particles may be derived from a pulverized product of the polishing pad waste containing the thermosetting polyurethane. When the polishing pad employs particles derived from waste of the polishing pad as a component of the polishing constant layer 102, the above-described technical purposes can be achieved, and an advantage of realizing an eco-friendly effect can also be obtained.

The binder may include a first urethane-based prepolymer and a first curing agent. For example, the first urethane-based prepolymer may include a reaction product of a first polyol compound and a first isocyanate compound. To specific examples and embodiments of the first urethane-based prepolymer, the first curing agent, the first isocyanate compound and the first polyol compound, and the technical advantages thereof, those described above regarding the polishing pad 110 may be similarly applied.

FIG. 4 is a schematic view schematically showing a method for preparing a semiconductor device according to an embodiment. Referring to FIG. 4, the polishing pad 110 may be provided on the surface plate 120. When the polishing pad 110 is provided on the surface plate 120, the first surface 11 of the polishing layer 10 may become the top surface, and the second surface 12 may be provided facing the surface plate 120.

In an embodiment, the polishing pad 110 and the surface plate 120 may be attached to each other through an adhesive layer. For example, the adhesive layer may be derived from a pressure-sensitive adhesive (PSA), but is not limited thereto.

The method for preparing the semiconductor device includes polishing a polishing object 130 while rotating the polishing pad 110 and the polishing object 130 relative to each other under a pressure condition, after arranging the polished surface of the polishing object 130 in contact with the first surface 11.

In an embodiment, the polishing object 130 may be a semiconductor substrate. For example, the polished surface of the semiconductor substrate may include a metal oxide film, a metal nitride film, or a metal film. In an embodiment, the polished surface may be a single layer made of one of a metal oxide, a metal nitride, and a metal. In another embodiment, the polished surface may be a composite film including at least two or more of a metal oxide, a metal nitride, and a metal.

In each of the metal oxide film, the metal nitride film, and the metal film, the metal component may include one selected from the group consisting of silicon (Si), copper (Cu), tantalum (Ta), titanium (Ti), molybdenum (Mo), and combinations thereof.

In an embodiment, the polished surface of the polishing object 130 may be a single film made of a silicon oxide film. In another embodiment, the polished surface of the polishing object 130 may be a single film made of a copper film. In another embodiment, the polished surface of the polishing object 130 may be a composite film including a silicon oxide film. In another embodiment, the polished surface of the polishing object 130 may be a composite film including a copper film.

The load by which the polished surface of the polishing object 130 is pressed against the first surface 11 can be appropriately designed according to the type and purpose of the polished surface, but it may be, for example, from about 0.01 psi to about 20 psi, or, for example, from about 0.1 psi to about 15 psi. As described above, the polishing pad 110 can have structural features subdivided in the thickness direction, and through these structural features, it can provide appropriate rigidity and elasticity corresponding to various purposes to the polished surface under pressure conditions within the aforementioned range. As a result, when the polishing object 130 includes a semiconductor substrate, the final polishing result of the semiconductor substrate can be greatly improved in terms of polishing flatness and defect prevention.

The polishing pad 110 and the polishing object 130 may rotate relative to each other with the polishing surface 11 and the polished surface in contact with each other. In this case, the rotational direction of the polishing object 130 and the rotational direction of the polishing pad 110 may be the same, or opposite to each other. The polishing surface 11 and the polished surface of the polishing object 130 may be in direct contact with each other, or may be in indirect contact with each other through a component contained in a fluid slurry or the like. The rotation speeds of the polishing object 130 and the polishing pad 110 may be each selected from the range of about 10 rpm to about 500 rpm depending on the purpose, and may be each, for example, from about 30 rpm to about 200 rpm, but are not limited thereto. As described above, the polishing pad 110 may provide polishing performance corresponding to various purposes through structural features subdivided in the thickness direction. When the polishing object 130 and the polishing pad 110 each rotate at rotation speeds within the aforementioned range while being in contact with each other, their behaviors by centrifugal force and frictional force are correlated with the structural features of the polishing pad 110, so excellent polishing results can be produced in terms of polishing flatness and defect prevention for the polished surface.

Referring to FIG. 1, the polishing layer 10 may include at least one polishing variable layer 101 which is a region from the polishing surface 11 to the separable interface 13; and at least one polishing constant layer 102 which is a region from the separable interface 13 to the second surface 12. Descriptions regarding the polishing variable layer 101 and the polishing constant layer 102 are all the same as described above regarding the polishing pad 110 and a method for preparing the same.

In the method for preparing the semiconductor device, the polishing variable layer 101 may have a first polishing variability index of about 0.1 to 11.0 according to Equation 1 above, for example, about 0.1 to about 9.0, for example, about 0.2 to about 9.0, for example, about 0.2 to about 8.5, for example, about 0.2 to about 8.0, for example, about 0.2 to about 7.5, for example, about 0.5 to about 7.5, for example, about 0.8 to about 7.5, for example, about 0.9 to about 7.5, for example, about 1.0 to about 6.0, for example, about 1.8 to 3.5, or, for example, about 1.8 to 2.5.

The polishing variable layer 101 is a region whose physical and/or chemical properties change during a polishing process of the method for preparing a semiconductor device to which the polishing pad 110 is applied, and has a predetermined lifespan in terms of providing a desired level of polishing performance. The lifespan introduction time of the polishing variable layer 101 refers to an arbitrary time point between after this region itself or the polishing pad 110 is manufactured and before it is applied to a process. Additionally, the lifespan end time of the polishing variable layer 101 refers to a time point when the polishing variable layer 101 no longer realizes the polishing performance, and thus the this region itself or the entire polishing pad 110 needs to be replaced.

The first polishing variability index according to Equation 1 above using the surface roughnesses (Ri, Rf) and the total thicknesses (Ti, Tf) of the polishing pad 110 at the lifespan introduction time and the lifespan end time of the polishing variable layer 101 as factors is an index indicating the variable performance of the polishing variable layer 101, and by retaining a variability corresponding to the value of Equation 1 above represented in the aforementioned range, i.e., from about 0.1 to about 11.0, the polishing variable layer 101 as a part of the polishing layer 10 can have structural features optimized for polishing efficiency, and at the same time, realize a constant polishing performance throughout its lifetime, so it can be more advantageous for mass-producing semiconductor devices of the same quality.

Ti may be, for example, from about 800 μm to about 5000 μm, for example, from about 1000 μm to about 4000 μm, for example, from about 1000 μm to 3000 μm, for example, from about 1500 μm to about 3000 μm, for example, from about 1700 μm to about 2700 μm, or, for example, from about 2000 μm to about 3500 μm, but is not limited thereto.

Ri may be, for example, from about 5 μm to about 15 μm, for example, from about 5 μm to about 12 μm, or, for example, from about 5 μm to 10 μm, but is not limited thereto.

In an embodiment, when Ti and Ri each satisfy the above-mentioned ranges, and at the same time, the first polishing variability index satisfies the above-mentioned range, it may be more advantageous in terms of realizing the polishing performance and the structural characteristics of the polishing variable layer 101.

In an embodiment, the polishing pad 110 may include at least one groove 14 on the polishing surface 11, the groove having a depth d1 smaller than or equal to the total thickness D1 of the polishing variable layer 101. The groove 14 can play a role in appropriately realizing physical polishing characteristics by adjusting the fluidity of the polishing liquid or polishing slurry supplied to the polishing surface 11 during the polishing process using the polishing pad 110, or by adjusting the size of the area in which the polishing surface 11 and the polished surface of a polishing object are in direct contact with each other.

For example, the polishing pad 110 may include a plurality of grooves 14 in the polishing surface 11. In an embodiment, the planar shape of the polishing pad 110 may be substantially circular, and the plurality of grooves 14 may have a concentric circular structure in which they are spaced apart at a predetermined distance from the center on the planar surface of the polishing pad 110 toward the edge. In another embodiment, the plurality of grooves 14 may have a radial structure in which they are continuously formed from the center on the planar surface of the polishing pad 110 toward the edge. In still another embodiment, the plurality of grooves 14 may include concentric circular grooves and radial grooves at the same time.

In the polishing variable layer 101, which is a region from the polishing surface 11 to the separable interface 13, the polishing surface 11 may include at least one groove 14. In this case, in the method for preparing a semiconductor device, a second polishing variability index according to Equation 2 above of the polishing variable layer 101 may be from about 0.1 to about 3.5, for example, from about 0.1 to about 3.3, for example, from about 0.1 to about 3.0, for example, from about 0.1 to about 2.0, for example, from about 0.3 to about 1.8, for example, from about 0.5 to about 1.5, for example, from about 0.5 to about 1.2, for example, from about 0.5 to 1.0, or, for example, from about 0.6 to about 1.0.

The second polishing variability index according to Equation 2 above of the polishing variable layer 101 may be from about 0.1 to about 3.5, for example, from about 0.1 to about 3.3, for example, from about 0.1 to about 3.0, for example, from about 0.1 to about 2.0, for example, from about 0.3 to about 1.8, for example, from about 0.5 to about 1.5, for example, from about 0.5 to about 1.2, or, for example, from about 0.5 to 1.0.

The description of the lifespan introduction time and the lifespan end time of the polishing variable layer 101 is the same as described above with respect to the first polishing variability index according to Equation 1 above. When the second polishing variability index of the polishing variable layer 101 satisfies the above-mentioned range, the polishing variable layer 101 can provide a structure optimized in terms of fluidity of the polishing liquid or polishing slurry, and a direct contact area provided with respect to the polished surface can be secured at an appropriate level, which may be more advantageous for securing a polishing rate within a target range.

The Gi may be, for example, from about 600 μm to about 900 μm, for example, from about 650 μm to about 900 μm, or, for example, from about 700 μm to about 900 μm, but is not limited thereto.

In an embodiment, when Ri and Gi each satisfy the above-mentioned ranges, and at the same time, the second polishing variability index satisfies the above-mentioned range, it may be more advantageous in terms of realizing the polishing performance by the structural characteristics of the polishing variable layer 101.

When the polishing surface 11 includes at least one groove 14 having a depth equal to or smaller than the total thickness of the polishing variable layer 101, the rate of change (%) of depth of the groove 14 in the polishing variable layer 101 according to Equation 3 above may be from about 20% to about 80%, for example, from about 30% to 80%, for example, from about 40% to about 80%, for example, from about 45% to about 75%, or, for example, from about 50% to about 70%.

When the first surface 11 includes at least one groove 14 having a depth equal to or smaller than the total thickness of the polishing variable layer 101, the rate of change (%) of the depth of the groove 14 in the polishing variable layer 101 according to Equation 3 above may be from about 20% to about 100%.

Referring to FIG. 1, the depth d1 of the groove 14 is changed from the depth Gi at the lifespan introduction time to the depth Gf at the lifespan end time during the polishing process. Specifically, as the polishing surface 11 and the polished surface of a polishing object are polished by physical contact with each other, thereby cutting the polishing surface 11, the depth d1 of the groove 14 gradually becomes shallower. In this regard, the value of Equation 3 above employing the depth Gi of the groove at the lifespan introduction time and the depth of the groove Gf at the lifespan end time as factors can satisfy the above-mentioned range when physical characteristics such as the elongation, tensile strength, hardness and the like of the polishing variable layer 101 are properly supported. Specifically, if the physical properties of the polishing variable layer 101 are not properly supported, the influence on the polishing performance induced by a change in the fluidity of the polishing slurry or the like increases with the more shallow depth d1 of the groove, and so there is a concern regarding the occurrence of the abrupt deterioration of the overall polishing performance. When the value of Equation 3 above satisfies the above-mentioned range, the polishing variable layer 101 according to an embodiment can exhibit the optimum physical properties corresponding thereto, based on which, even if the depth d1 of the groove becomes shallow, the influence on the polishing performance can be minimized to realize excellent polishing performance throughout the polishing process according to the method for preparing a semiconductor device.

When the polishing pad 110 includes at least one groove in the polishing surface 11, the width w1 of the groove 14 may be from about 0.2 mm to about 1.0 mm, for example, from about 0.3 mm to about 0.8 mm, or, for example, from about 0.4 mm to about 0.7 mm. When the width of the groove 14 satisfies the aforementioned range, the size of the contact area between the polished surface of the polishing object 130 and the polishing surface 11 can be properly secured, the fluidity of the polishing liquid or polishing slurry applied to the polishing surface 11 is secured at an appropriate level, so that the final polishing performance can be excellently realized.

When the polishing pad 110 includes a plurality of grooves 14 on the polishing surface 11, the pitch p1 of the groove 14, which is defined as the spacing between two adjacent grooves 14, can also be appropriately designed under the same context as the width w1 of the groove 14, thereby contributing to the realization of the polishing performance required in the method for preparing a semiconductor device. For example, the pitch p1 of the grooves 14 may be from about 1.5 mm to about 5.0 mm, for example, from about 1.5 mm to about 4.0 mm, or, for example, from about 1.5 mm to about 3.0 mm.

Referring to FIG. 4, in an embodiment, the method for preparing a semiconductor device may further include supplying a polishing slurry 150 onto the polishing surface 11 of the polishing pad 110. For example, the polishing slurry 150 may be supplied onto the polishing surface 11 through a supply nozzle 140.

The flow rate of the polishing slurry 150 sprayed through the supply nozzle 140 may be from about 10 ml/min to about 1,000 ml/min, for example, from about 10 ml/min to about 800 ml/min, or, for example, from about 50 ml/min to about 500 ml/min, but is not limited thereto.

The polishing slurry 150 may include a silica slurry or a ceria slurry, but is not limited thereto.

Referring to FIG. 4, the polishing object 130 may be polished while being mounted on a polishing head 160 and being pressed to the polishing surface 11 with a predetermined load. When being mounted on the polishing head 160, the polishing object 130 may be arranged such that its polished surface faces the polishing surface 11. The load by which the polished surface of the polishing object 130 is pressed against the polishing surface 11 can be appropriately designed according to the type and purpose of the polished surface, but it may be, for example, from about 0.01 psi to about 20 psi, for example, from about 0.1 psi to about 15 psi, for example, from about 1 psi to about 12 psi, or, for example from about 3 psi to about 6 psi.

In an embodiment, in order to maintain the polishing surface 11 of the polishing pad 110 in a state suitable for polishing, the method for preparing a semiconductor device may further include processing the polishing surface 11 through a conditioner 170 at the same time as polishing the polishing object 130.

The conditioner 170 may serve to roughen the polishing surface 11 while rotating at a predetermined rotation speed. The rotation speed of the conditioner 170 may be, for example, from about 50 rpm to about 150 rpm, or, for example, from about 80 rpm to about 120 rpm. Through the surface treatment by rotation of the conditioner 170, the polishing surface 11 can maintain an optimal surface state throughout the polishing process, and it is possible to obtain an effect of prolonging the polishing lifespan.

The pressing pressure of the conditioner 170 against the polishing surface 11 may be, for example, from about 1 lbf to about 12 lbf, or, for example, from about 3 lbf to about 9 lbf. Through the surface treatment performed while pressing the conditioner 170 under these conditions, the polishing surface 11 can maintain an optimal surface state throughout the polishing process, and it is possible to obtain an effect of prolonging the polishing lifespan.

EXAMPLES AND COMPARATIVE EXAMPLES

Example 1

An aromatic diisocyanate containing 25 parts by weight of 2,6-toluene diisocyanate (2,6-TDI) based on 100 parts by weight of 2,4-toluene diisocyanate (2,4-TDI) was prepared, and an isocyanate component was prepared by mixing 11 parts by weight of 4,4'-dicyclohexylmethane diisocyanate ($H_{12}MDI$) based on 100 parts by weight of the total aromatic diisocyanate. 130 parts by weight of polytetramethylene ether glycol (PTMG) having a weight average molecular weight (Mw) of 1,000 g/mol based on 100 parts by weight of the total isocyanate component was prepared, and a polyol component was prepared by mixing 14 parts by weight of diethylene glycol (DEG) having a weight average molecular weight (Mw) of 106 g/mol based on 100 parts by weight of the total isocyanate component. A preliminary composition including a urethane-based prepolymer was prepared by inputting the mixed raw material including the isocyanate component and the polyol component into a four-neck flask and reacting the same at 80° C. The content of isocyanate groups (NCO groups) in the preliminary composition was adjusted to 9% by weight. To the preliminary composition, 4,4'-methylenebis(2-chloroaniline) (MOCA) was mixed as a curing agent until the molar ratio of the NH2 groups of the MOCA to the NCO groups in the preliminary composition reached 0.96. Additionally, 1.0 parts by weight of a solid phase blowing agent (Akzonobel Company) as expandable particles and 1.0 parts by weight of a silicone surfactant (OFX-193) were mixed to the preliminary composition. The preliminary composition was injected at a discharge rate of 10 kg/min into a mold having a width of 1,000 mm, a length of 1,000 mm, and a height of 3 mm, and preheated to 90° C., while at the same time, Nitrogen ($N_2$) gas as a gas phase blowing agent was injected at an injection rate of 1.0 L/min for the same period of time as the injection time of the preliminary composition. Then, the preliminary composition was subjected to a post-curing reaction under a temperature condition of 110° C. to prepare a sheet. The sheet was subjected to a line turning process, and concentric grooves having a width w1 of 0.5 mm, a pitch p1 of 3.0 mm, and a depth d1 of 0.85 mm were made on its surface to prepare a polishing variable layer having a thickness of 1.0 mm.

Meanwhile, an aromatic isocyanate compound containing 4,4'-diphenylmethanediisocyanate (MDI) was prepared, and it was mixed with 18 parts by weight of 1,4-butanediol and 71 parts by weight of polytetramethylene ether glycol (PTMG 650) based on 100 parts by weight of the MDI, and the resulting material was inputted into a cake-shaped mold having a width of 1,000 mm, a length of 1,000 mm, and a height of 3 mm, and preheated to 80° C., and then, it was cured for 120 minutes, post-cured at room temperature, aged for 12 hours at 110° C., and sliced to a thickness of 1.0 mm to prepare a polishing constant layer.

Meanwhile, a cushion layer having a structure in which a polyester resin non-woven fabric was impregnated with a urethane-based resin, and having a thickness of 1.1 mm was prepared.

Double-sided adhesive tapes were attached to the rear surface opposite to the surface of the polishing variable layer on which the groove was generated, both surfaces of the polishing constant layer, and one surface of the cushion layer, and the polishing variable layer, the polishing constant layer, and the cushion layer were sequentially stacked, while being arranged such that the adhesive tape attachment surfaces were in contact with each other, and then laminated to prepare a polishing pad having a total thickness of 3.2(±0.5) mm.

Example 2

An aromatic isocyanate compound containing 4,4'-diphenylmethanediisocyanate (MDI) was prepared, and it was mixed with 14 parts by weight of 1,4-butanediol and 100 parts by weight of polytetramethylene ether glycol (PTMG 650) based on 100 parts by weight of the MDI, and the resulting material was inputted into a cake-shaped mold having a width of 1,000 mm, a length of 1,000 mm, and a height of 3 mm, and preheated to 80° C., and then, it was cured for 120 minutes, post-cured at room temperature, aged for 12 hours at 110° C., and sliced to a thickness of 1.0 mm to prepare a polishing constant layer.

Meanwhile, a cushion layer having a structure in which a polyester resin non-woven fabric was impregnated with a urethane-based resin, and having a thickness of 1.1 mm was prepared.

Double-sided adhesive tapes were attached to the rear surface opposite to the surface of the polishing variable layer on which the groove was generated, both surfaces of the polishing constant layer, and one surface of the cushion layer, and the polishing variable layer, the polishing constant layer, and the cushion layer were sequentially stacked, while being arranged such that the adhesive tape attachment surfaces were in contact with each other, and then laminated to prepare a polishing pad having a total thickness of 3.2(±0.5) mm.

Comparative Example 1

A polishing pad was prepared in the same manner as in Example 1 above, except that the polishing variable layer was prepared to a thickness of 2.0 mm, excluding the polishing constant layer of Example 1 above, and that, after attaching the double-sided adhesive tapes to the rear surface opposite to the surface of the polishing variable layer on which the groove was generated, and one surface of the cushion layer, the two layers were arranged such that the adhesive tape attachment surfaces were in contact with each other, and then laminated to prepare a polishing pad having a total thickness of 3.1(±0.5) mm.

Comparative Example 2

A polishing pad was prepared in the same manner as in Example 1 above, except that the polishing constant layer of Example 1 was excluded, and that, after attaching the double-sided adhesive tapes to the rear surface opposite to the surface of the polishing variable layer on which the groove was generated, and one surface of the cushion layer, the two layers were arranged such that the adhesive tape attachment surfaces were in contact with each other, and then laminated to prepare a polishing pad having a total thickness of 2.1(±0.5) mm.

Comparative Example 3

A polishing pad was prepared in the same way as in Example 1 above, except that an aromatic isocyanate compound containing 4,4'-diphenylmethanediisocyanate (MDI) was prepared, and it was mixed with 11 parts by weight of 1,4-butanediol and 120 parts by weight of polytetramethylene ether glycol (PTMG 650) based on 100 parts by weight of the MDI, and the resulting material was inputted into a cake-shaped mold having a width of 1,000 mm, a length of 1,000 mm, and a height of 3 mm, and preheated to 80° C., and then, it was cured for 120 minutes, post-cured at room temperature, aged for 12 hours at 110° C., and sliced to a thickness of 1.0 mm to prepare a polishing constant layer.

Evaluation

Experimental Example 1: Hardness Characteristic Evaluation

The Shore D hardness of the laminated structure consisting of at least one of the polishing variable layer, the polishing constant layer, the cushion layer, and combinations thereof for each of the Examples and Comparative Examples was measured. Specifically, samples were prepared by cutting the width and length to a size of 5 cm×5 cm size, and each sample was stored at 25° C. for 12 hours, and then measured using a durometer (Bareiss, HPEIII). Further, based on each hardness measurement, the ratio (H2/H1) of the hardness (H1) of the polishing variable layer and the hardness (H2) of the polishing constant layer; a ratio (Hc/Hp) of the hardness (Hp) of the polishing layer and the hardness (Hc) of the cushion layer; and a ratio (Hp/Ht) of the hardness (Hp) of the polishing layer and the hardness (Ht) of the entire polishing pad were calculated. The results are as shown in Table 1 below.

Experimental Example 2: Compression Characteristic Evaluation

For each polishing pad sample 25 mm×25 mm of the Examples and Comparative Examples, the initial thickness (D1) at the no-load state, and the deformed thickness (D2) by pressing under pressure conditions of pressing the sample with an 800 g weight for 3 minutes at room temperature were measured, and then the compression ratio (%) was derived using the formula (D1−D2)/D1×100.

Experimental Example 3: Polishing Variability Evaluation

For each of the Examples and Comparative Examples, the surface roughness (Ri) of the first surface of the polishing variable layer after each polishing pad was manufactured and before being applied to the polishing process was measured based on the centerline average roughness (Ra), and the total thickness (Ti) of each polishing pad and the depth (Gi) of the groove on each first surface were measured.

Then, lifespan prediction evaluation was performed by simulating the actual polishing evaluation for each polishing pad. The pad was aged using a dummy wafer having a silicon oxide film, a calcined ceria slurry (ACS-350 from KC Tech Company), and a 4-inch conditioner, and a change in the polishing rate was measured by inputting a monitoring wafer hourly. The polishing conditions were evaluated at a pressure condition of 4.0 psi to the polishing surface of the polishing head and a slurry inflow flow rate of 200 mm/L.

For each polishing pad, the time point at which the polishing rate changed by 20% from the initial polishing rate was regarded as the lifespan end time of the polishing pad, and the surface roughness (Rf) of the first surface of the polishing variable layer of each dried polishing pad was measured based on the centerline average roughness (Ra), and the total thickness (Tf) of each polishing pad and the depth (GO of the groove on each first surface were measured. The results are shown in Table 1 below.

Experimental Example 4: Polishing Performance Evaluation

For each polishing pad of the Examples and Comparative Examples, polishing was performed in the same manner as in Experimental Example 3 above, and then, each polishing performance was evaluated as follows. The results are as shown in Table 1.

(1) Average Polishing Rate

Polishing was performed in the same manner as in Experimental Example 3 above, but the film thickness change before and after the polishing was measured using an optical interference thickness measuring device (SI-F80R, Kyence Company) for the dried silicon wafer after polishing for 1 minute. Then, the polishing rate was calculated using the following equation. In this way, the polishing rate was measured a total of 5 times, and a number average value was obtained, which was used as the average polishing rate.

$$\text{Polishing rate(Å/min)} = \text{polishing thickness of silicon wafer(Å)/polishing time(min)}$$

(2) Defect

The polishing was performed in the same manner as in Experimental Example 3 above, but the polished surface of the polishing object after polishing for 1 minute was observed with the naked eye to derive the number of defects such as scratches. Specifically, after polishing, the silicon wafer was moved to a cleaner where it was washed for 10 seconds using 1% hydrogen fluoride (HF) and purified water (DIW), and for 10 seconds using 1% nitric acid (H2NO3) and purified water (DIW). Thereafter, it was moved to a spin dryer where it washed with purified water (DIW), and then dried with nitrogen ($N_2$) for 15 seconds. Changes in defects before and after the polishing of the dried silicon wafer were observed with the naked eye using a Defect measuring equipment (XP+, Tenkor Company).

(3) Polishing Flatness

Polishing was performed in the same manner as in Experimental Example 3 above, but after polishing for 1 minute, the in-plane film thickness of the wafer was measured at 98 locations, and the polishing flatness (WIWNU: Within Wafer Non Uniformity, %) was derived using the equation of (standard deviation of polished thickness (Å)/average polishing thickness (Å))×100.

TABLE 1

| | | | Example 1 | Example 2 | Comparative Example 1 | Comparative example 2 | Comparative Example 3 |
|---|---|---|---|---|---|---|---|
| Hardness | Polishing variable layer (H1) | Shore D | 55.5 | 55.5 | 55.5 | 55.5 | 55.5 |
| | Polishing constant layer (H2) | Shore D | 55.5 | 40 | — | — | 20 |
| | Polishing layer (Hp) | Shore D | 55.3 | 50 | 55.5 | 55.5 | 45 |
| | Cushion layer (Hc) | Asker C | 70 | 70 | 70 | 70 | 70 |
| | Polishing pad total (Ht) | Shore D | 55 | 48 | 54 | 45 | 43 |
| Hardness ratio | H2/H1 | | 0.99 | 0.72 | — | — | 0.36 |
| | H1/H2 | | 1.01 | 1.39 | — | — | 2.78 |
| | Hc/Hp | | 1.27 | 1.40 | 1.26 | 1.26 | 1.56 |
| | Ht/Hp | | 0.99 | 0.96 | 0.97 | 0.81 | 0.96 |
| Thickness | Polishing variable layer | | 1.0 | 1.0 | 2.0 | 1.0 | 1.0 |
| | Polishing constant layer | | 1.0 | 1.0 | — | — | 1.0 |
| | Cushion layer | | 1.1 | 1.1 | 1.1 | 1.1 | 1.1 |
| | Polishing pad total | | 3.1 | 3.1 | 3.1 | 2.1 | 3.1 |

TABLE 1-continued

| | | | Example 1 | Example 2 | Comparative Example 1 | Comparative example 2 | Comparative Example 3 |
|---|---|---|---|---|---|---|---|
| Polishing pad compressibility [%] | | | 1.1 | 1.4 | 0.9 | 2.0 | 1.8 |
| Polishing variability | Lifespan introduction time [μm] | Surface roughness (Ri) | 7.5 | 7.5 | 7.5 | 7.5 | 7.5 |
| | | Polishing pad total thickness (Ti) | 3100.0 | 3100.0 | 3100.0 | 2100.0 | 3100.0 |
| | | Groove depth (Gi) | 850.0 | 850.0 | 850.0 | 850.0 | 850.0 |
| | Lifespan end time [μm] | Surface roughness (Rf) | 4.3 | 4.5 | 4.4 | 4.4 | 4.2 |
| | | Polishing pad total thickness (Tf) | 2520 | 2461 | 2532 | 1485 | 2410 |
| | | Groove depth (Gf) | 370 | 311 | 382 | 235 | 260 |
| | First polishing variability index | | 2.28 | 1.94 | 2.26 | 1.41 | 1.98 |
| | Second polishing variability index | | 0.76 | 0.63 | 0.75 | 0.57 | 0.63 |
| | Rate of change of groove depth [%] | | 56.5 | 63.4 | 55.1 | 72.4 | 69.4 |
| Polishing performance | Average polishing rate [Å/min] | | 2883 | 2710 | 2803 | 2522 | 2398 |
| | Polishing flatness [%] | | 3.0 | 4.5 | 3.1 | 5.2 | 4.8 |
| | Defect [number] | | 2 | 3 | 2 | 3 | 3 |

Referring to Table 1 above, it was confirmed that the polishing pads of Examples 1 and 2 above realize polishing performance equal to, or excellent polishing performance higher than those of Comparative Examples 1 to 3 above in terms of polishing rate, defects, and polishing flatness by applying the laminated structure of the polishing variable layer and the polishing constant layer of different materials to the polishing layer, and by designing the mutual hardness ratio of the two layers to satisfy the range of about 0.50 to about 1.50. At this time, it was confirmed that the polishing pads of Examples 1 and 2 above obtained improved effects in terms of productivity and economic efficiency in addition to the original polishing function, by applying a thermoplastic resin raw material, which is easy to recycle, as a raw material for the polishing constant layer.

Hereinafter, specific examples of the present disclosure are presented. However, the examples described below are merely for specifically illustrating or explaining the present disclosure, and the scope of the present disclosure is not construed as being limited by these examples, but is determined by the claims.

Example 3

An aromatic diisocyanate containing 25 parts by weight of 2,6-toluene diisocyanate (2,6-TDI) based on 100 parts by weight of 2,4-toluene diisocyanate (2,4-TDI) was prepared, and an isocyanate component was prepared by mixing 11 parts by weight of 4,4'-dicyclohexylmethane diisocyanate ($H_{12}$MDI) based on 100 parts by weight of the total aromatic diisocyanate. 130 parts by weight of polytetramethylene ether glycol (PTMG) having a weight average molecular weight (Mw) of 1,000 g/mol based on 100 parts by weight of the total isocyanate component was prepared, and a polyol component was prepared by mixing 14 parts by weight of diethylene glycol (DEG) having a weight average molecular weight (Mw) of 106 g/mol based on 100 parts by weight of the total isocyanate component. A preliminary composition including a urethane-based prepolymer was prepared by inputting the mixed raw material including the isocyanate component and the polyol component into a four-neck flask and reacting the same at 80° C. The content of isocyanate groups (NCO groups) in the preliminary composition was adjusted to 9% by weight. To the preliminary composition, 4,4'-methylenebis(2-chloroaniline) (MOCA) was mixed as a curing agent until the molar ratio of the $NH_2$ groups of the MOCA to the NCO groups in the preliminary composition reached 0.96. Additionally, 1.0 parts by weight of a solid phase blowing agent (Akzonobel Company) as expandable particles and 1.0 parts by weight of a silicone surfactant (OFX-193) were mixed to the preliminary composition. The preliminary composition was injected at a discharge rate of 10 kg/min into a mold having a width of 1,000 mm, a length of 1,000 mm, and a height of 3 mm, and preheated to 90° C., while at the same time, Nitrogen ($N_2$) gas as a gas phase blowing agent was injected at an injection rate of 1.0 L/min for the same period of time as the injection time of the preliminary composition. Then, the preliminary composition was subjected to a post-curing reaction under a temperature condition of 110° C. to prepare a sheet. The sheet was subjected to a line turning process, and concentric grooves having a width w1 of 0.5 mm, a pitch p1 of 3.0 mm, and a depth d1 of 0.85 mm were made on its surface to prepare a polishing variable layer having a thickness of 1.0 mm.

The by-product generated during groove and thickness processing of the polishing variable layer was pulverized to have an average particle diameter of 1 to 2 mm (average particle diameter of about 1.5 mm) using a grinding machine. Next, a preliminary composition including the same urethane-based prepolymer as the urethane-based prepolymer of the polishing variable layer was prepared. A composition for a binder was prepared by mixing a curing agent (LA-750, OH-V 750, MCNS Company) having an alcohol group as a reactive group as a curing agent to the preliminary composition, so that the molar ratio of the OH groups of the curing agent to the NCO groups in the preliminary composition was 1.0. The thermosetting polyurethane particles were mixed with each other so that about 100 parts by weight thereof with respect to 100 parts by weight of the composition for a binder was included, and then injected onto a circular mold having an open top and having a diameter of 33 inches. Then, it was cured for 10 hours under a temperature condition of 110° C. to obtain a cured product. The cured product was subjected to a slicing process to prepare a polishing constant layer having a thickness of 1.0 mm.

Meanwhile, a cushion layer having a structure in which a polyester resin non-woven fabric was impregnated with a urethane-based resin, and having a thickness of 1.1 mm was prepared.

Double-sided adhesive tapes were attached to the rear surface opposite to the surface of the polishing variable layer on which the groove was generated, both surfaces of the polishing constant layer, and one surface of the cushion layer, and the polishing variable layer, the polishing constant layer, and the cushion layer were sequentially stacked, while being arranged such that the adhesive tape attachment surfaces were in contact with each other, and then laminated to prepare a polishing pad having a total thickness of 3.2(±0.5) mm.

Example 4

A polishing pad was prepared in the same manner as in the preparation of the polishing constant layer of Example 3 above, except that about 900 parts by weight of the thermosetting polyurethane particles were mixed to be included with respect to 100 parts by weight of the composition for a binder.

Example 5

A polishing pad was prepared in the same manner as in the preparation of the polishing constant layer of Example 3 above, except that about 11 parts by weight of the thermosetting polyurethane particles were mixed to be included with respect to 100 parts by weight of the composition for a binder.

Comparative Example 4

A polishing pad was prepared in the same manner as in Example 3 above, except that the polishing variable layer was prepared to a thickness of 2.0 mm, excluding the polishing constant layer of Example 3 above, and that, after attaching the double-sided adhesive tapes to the rear surface opposite to the surface of the polishing variable layer on which the groove was generated, and one surface of the cushion layer, the two layers were arranged such that the adhesive tape attachment surfaces were in contact with each other, and then laminated to prepare a polishing pad having a total thickness of 3.1(±0.5) mm.

Evaluation

Experimental Example 5: Polishing Pad Hardness Evaluation

For each of the polishing pads of the Examples and Comparative Examples, Shore D hardness of the first surface, which was the polishing surface, was measured. Specifically, samples were prepared by cutting the width and length to a size of 5 cm×3 cm size, and each sample was stored at 25° C. for 12 hours, and then measured using a Shore D durometer. The results are as shown in Table 2 below.

Experimental Example 6: Polishing Pad Compressibility Evaluation

For each of the polishing pads of the Examples and Comparative Examples, the initial thickness (D1) at the no-load state, and the deformed thickness (D2) by pressing under pressure conditions of pressing the sample with a cylindrical weight of 2400 g having a cross-sectional area of a diameter of 25 mm and for 1 minute at room temperature were measured, and then the compression ratio (%) was derived using the formula (D1−D2)/D1×100.

Experimental Example 7: Polishing Variability Evaluation

For each of the Examples and Comparative Examples, the surface roughness (Ri) of the first surface of the polishing variable layer after each polishing pad was manufactured and before being applied to the polishing process was measured based on the centerline average roughness (Ra), and the total thickness (Ti) of each polishing pad and the depth (Gi) of the groove on each first surface were measured.

Then, for each polishing pad, silicon oxide ($SiO_2$) was deposited on a silicon wafer having a diameter of 300 mm by a chemical vapor deposition (CVD) process. The polishing pad was attached to the CMP equipment, and the surface of the silicon oxide layer of the silicon wafer was installed to face the polishing surface of the polishing pad. The silicon wafer was pressed onto the polishing surface with a load of 3.0 psi while supplying the calcined ceria slurry onto the polishing pad at a rate of 250 mL/min, and the silicon oxide film was polished at a rotation speed of 100 rpm of each of the polishing pad and the silicon wafer. After the polishing was performed until the polishing rate changed by 20% from the initial polishing rate, the silicon wafer was removed from the carrier, mounted on a spin dryer, washed with distilled water, and dried with nitrogen for 15 seconds.

For each polishing pad, the time point at which the polishing rate changed by 20% from the initial polishing rate was regarded as the lifespan end time of the polishing pad, and the surface roughness (Rf) of the first surface of the polishing variable layer of each dried polishing pad was measured based on the centerline average roughness (Ra), and the total thickness (Tf) of each polishing pad and the depth (GO of the groove on each first surface were measured.

Then, the first polishing variability index and the second polishing variability index were derived using Equations 1 and 2 above, and the results are shown in Table 1 below.

Experimental Example 8: Polishing Performance Evaluation

For each polishing pad of the Examples and Comparative Examples, polishing was performed in the same manner as in Experimental Example 3 above, and then, each polishing performance was evaluated as follows. The results are as shown in Table 1.

(4) Average Polishing Rate

Polishing was performed in the same manner as in Experimental Example 6 above, but the film thickness change before and after the polishing was measured using an optical interference thickness measuring device (F54, Filmetrics Company) for the dried silicon wafer after polishing for 1 minute. Then, the polishing rate was calculated using the following equation. In this way, the polishing rate was measured a total of 5 times, and a number average value was obtained, which was used as the average polishing rate.

$$\text{Polishing rate(Å/min)} = \text{polishing thickness of silicon wafer(Å)/polishing time(min)}$$

(5) Defect

The polishing was performed in the same manner as in Experimental Example 6 above, but the polished surface of the polishing object after polishing for 1 minute was observed with the naked eye to derive the number of defects such as scratches. Specifically, after polishing, the silicon wafer was moved to a cleaner where it was washed for 10 seconds using 1% hydrogen fluoride (HF) and purified water (DIW), and for 10 seconds using 1% nitric acid (H2NO3) and purified water (DIW). Thereafter, it was moved to a spin dryer where it washed with purified water (DIW), and then dried with nitrogen ($N_2$) for 15 seconds. Changes in defects before and after the polishing of the dried silicon wafer were observed with the naked eye using a Defect measuring equipment (XP+, Tenkor Company).

(6) Polishing Flatness

Polishing was performed in the same manner as in Experimental Example 6 above, but after polishing for 1 minute, the in-plane film thickness of the wafer was measured at 49 locations, and the polishing flatness (WIWNU: Within Wafer Non Uniformity, %) was derived using the equation of (standard deviation of polished thickness (Å)/average polishing thickness (Å))×100.

TABLE 2

| | | Example 3 | Example 4 | Example 5 | Comparative Example 4 |
|---|---|---|---|---|---|
| Polishing constant layer composition | Binder | To 100 | To 100 | To 100 | — |
| | Pulverized particles | 100 | 900 | 11 | — |
| Polishing pad physical properties | First surface hardness (Shore D) | 53 | 52 | 55 | 53 |
| | Compressibility (%) | 0.8 | 1.0 | 0.7 | 0.9 |
| Thickness [mm] | Polishing variable layer | 1.0 | 1.0 | 1.0 | 2.0 |
| | Polishing constant layer | 1.0 | 1.0 | 1.0 | — |
| | Cushion layer | 1.1 | 1.1 | 1.1 | 1.1 |
| | Polishing pad total | 3.1 | 3.1 | 3.1 | 3.1 |
| Polishing variability | Lifespan introduction time [μm] | Surface roughness (Ri) | 7.5 | 7.5 | 7.5 | 7.5 |
| | | Polishing pad total thickness (Ti) | 3100.0 | 3100.0 | 3100.0 | 3100.0 |
| | | Groove depth (Gi) | 850.0 | 850.0 | 850.0 | 850.0 |
| | Lifespan end time [μm] | Surface roughness (Rf) | 4.8 | 4.6 | 4.7 | 4.6 |
| | | Polishing pad total thickness (Tf) | 2700 | 2680 | 2730 | 2710 |
| | | Groove depth (Gf) | 450 | 430 | 480 | 460 |
| | First polishing variability index | | 2.79 | 2.85 | 3.13 | 3.07 |
| | Second polishing variability index | | 0.77 | 0.78 | 0.86 | 0.84 |
| | Rate of change of groove depth [%] | | 47.06 | 49.41 | 43.53 | 45.88 |
| Polishing performance | Average polishing rate [Å/min] | | 3699 | 3680 | 3601 | 3765 |
| | Polishing flatness [%] | | 5.3 | 4.9 | 5.0 | 5.3 |
| | Defect [number] | | 1 | 2 | 1 | 2 |

Referring to Table 2 above, the polishing pads of Examples 3 to 5 above included the polishing variable layer and the polishing constant layer, and as the polishing constant layer, and applied, as the polishing constant layer, the recycled layer in which pulverized particles, that had been obtained by pulverizing a by-product generated during groove and thickness processing of the polishing variable layer to an average particle diameter of 1 to 2 mm (average particle diameter of about 1.5 mm) using a pulverizer, were applied together with a predetermined binder. Comparative Example 4 above was a polishing pad without the application of such recycled layer, and the polishing pads of Examples 3 to 5 above realized polishing performances equivalent to that of Comparative Example 4 above even though they included the recycled configuration, so it can be confirmed that in addition to the original polishing function, an improved effect was obtained in terms of process productivity and economic feasibility.

While the preferred embodiments of the present disclosure have been described in detail above, the scope of the patent right of the present disclosure is not limited thereto, but various modifications and improvements which could be made by those skilled in the art using the basic concept of the present disclosure defined in the following claims would also fall within the scope of the patent right of the present disclosure.

The invention claimed is:

1. A polishing pad comprising:

a polishing layer, wherein the polishing layer includes a polishing variable layer having a polishing surface; and a polishing constant layer disposed on a rear surface side of the polishing variable layer opposite to the polishing surface, and wherein the polishing variable layer refers to a region whose physical and/or chemical characteristics change during a polishing process using the polishing pad, wherein the polishing constant layer refers to a region whose physical and/or chemical characteristics do not change during a polishing process using the polishing pad, wherein an interface between the polishing variable layer and the polishing constant layer is a separable interface, and wherein a ratio of shore D hardness of the polishing variable layer and shore D hardness of the polishing constant layer is from 0.50 to 1.50, and wherein the polishing variable layer is from 30% to 60% by volume of a total volume of the polishing layer, and wherein a first polishing variability index of the polishing variable layer according to Equation 1 below is from 0.1 to 11.0:

$$\frac{(Ri - Rf) \cdot Ti}{(Ti - Tf) \cdot Ri} \qquad \text{[Equation 1]}$$

wherein Ri is a surface roughness (Ra) of the polishing surface at a lifespan introduction time of the polishing variable layer, Rf is a surface roughness (Ra) of the polishing surface at a lifespan end time of the polishing variable layer, Ti is a total thickness of the polishing pad at the lifespan introduction time of the polishing variable layer, and Tf is the total thickness of the polishing pad at the lifespan end time of the polishing variable layer.

2. The polishing pad of claim 1, wherein the polishing variable layer includes at least one groove on the polishing surface, the groove having a depth that is less than or equal to a total thickness of the polishing variable layer, and wherein a second polishing variability index of the polishing variable layer according to Equation 2 below is from 0.1 to 3.5:

$$\frac{(Ri - Rf) \cdot Gi}{(Gi - Gf) \cdot Ri}$$ [Equation 2]

wherein Ri is a surface roughness (Ra) of the polishing surface at a lifespan introduction time of the polishing variable layer, Rf is a surface roughness (Ra) of the polishing surface at a lifespan end time of the polishing variable layer, Gi is the depth of the groove at the lifespan introduction time of the polishing variable layer, and Gf is the depth of the groove at the lifespan end time of the polishing variable layer.

3. The polishing pad of claim 1, wherein the polishing variable layer includes at least one groove on the polishing surface, the groove having a depth that is less than or equal to a total thickness of the polishing variable layer, and wherein a depth change rate (%) of the groove according to Equation 3 below is from 20% to 100%:

$$\frac{(Gi - Gf)}{Gi} \times 100$$ [Equation 3]

wherein Gi is the depth of the groove at the lifespan introduction time of the polishing variable layer, and Gf is the depth of the groove at the lifespan end time of the polishing variable layer.

4. The polishing pad of claim 1, wherein Shore D hardness for an entire laminated structure is from 45 to 70.

5. The polishing pad of claim 1, wherein the polishing variable layer includes a thermosetting resin, and wherein the polishing constant layer includes a thermoplastic resin.

6. The polishing pad of claim 1, wherein the polishing variable layer includes a cured product of a preliminary composition having a urethane-based prepolymer.

7. The polishing pad of claim 1, wherein the polishing constant layer includes one selected from the group consisting of polyethylene (PE), polypropylene (PP), polystyrene (PS), polyvinylchloride (PVC), thermoplastic polyurethane (TPU), and combinations thereof.

8. The polishing pad of claim 1, wherein the polishing constant layer includes a cured product of a composition having thermosetting polyurethane particles and a binder.

9. The polishing pad of claim 8, wherein each of the polishing variable layer and the polishing constant layer includes at least one layer.

10. The polishing pad of claim 8, wherein an average particle diameter of the thermosetting polyurethane particles is from 20 μm to 3.0 mm.

11. The polishing pad of claim 8, wherein the binder includes a first urethane-based prepolymer and a first curing agent.

12. The polishing pad of claim 8, wherein the composition includes from 15 parts by weight to 150 parts by weight of the binder with respect to 100 parts by weight of the thermosetting polyurethane particles.

13. The polishing pad of claim 8, wherein the polishing variable layer includes a cured product of a composition including a second urethane-based prepolymer.

14. A method for preparing a semiconductor device, the method comprising:

providing a polishing pad on a surface plate, the polishing pad including a polishing layer having a polishing surface; and polishing a polishing object while rotating the polishing pad and the polishing object relative to each other under a pressure condition after arranging a polished surface of the polishing object to be in contact with the polishing surface, wherein the polishing layer includes a polishing variable layer having the polishing surface, and a polishing constant layer disposed on a rear surface side of the polishing variable layer opposite to the polishing surface, wherein the polishing variable layer refers to a region of which physical and/or chemical characteristics change during a polishing process using the polishing pad, wherein the polishing constant layer refers to a region of which physical and/or chemical characteristics do not change during a polishing process using the polishing pad, wherein an interface between the polishing variable layer and the polishing constant layer is a separable interface, wherein a ratio of shore D hardness of the polishing variable layer and shore D hardness of the polishing constant layer is from 0.50 to 1.50, wherein the polishing variable layer is from 30% to 60% by volume of a total volume of the polishing layer, and wherein a first polishing variability index of the polishing variable layer according to Equation 1 below is from 0.1 to 11.0:

$$\frac{(Ri - Rf) \cdot Ti}{(Ti - Tf) \cdot Ri}$$ [Equation 1]

wherein Ri is a surface roughness (Ra) of the polishing surface at a lifespan introduction time of the polishing variable layer, Rf is a surface roughness (Ra) of the polishing surface at a lifespan end time of the polishing variable layer, Ti is a total thickness of the polishing pad at the lifespan introduction time of the polishing variable layer, and Tf is the total thickness of the polishing pad at the lifespan end time of the polishing variable layer.

15. The method of claim 14, wherein the polishing constant layer includes a cured product of a composition having thermosetting polyurethane particles and a binder.

16. The method of claim 14, wherein a load by which the polished surface of the polishing object is pressed against the polishing surface of the polishing layer is from 0.01 psi to 20 psi.

* * * * *